(12) United States Patent
Reyes et al.

(10) Patent No.: US 8,206,995 B2
(45) Date of Patent: Jun. 26, 2012

(54) METHOD FOR MANUFACTURING A RESISTIVE SWITCHING MEMORY DEVICE AND DEVICES OBTAINED THEREOF

(75) Inventors: Judit Gloria Lisoni Reyes, Oud-Heverlee (BE); Ludovic Goux, Hannut (BE); Dirk Wouters, Leuven (BE)

(73) Assignee: IMEC (BE)

( * ) Notice: Subject to any disclaimer, the term of this patent is extended or adjusted under 35 U.S.C. 154(b) by 27 days.

(21) Appl. No.: 12/631,361

(22) Filed: Dec. 4, 2009

(65) Prior Publication Data
US 2010/0155687 A1    Jun. 24, 2010

Related U.S. Application Data

(60) Provisional application No. 61/140,762, filed on Dec. 24, 2008.

(30) Foreign Application Priority Data

Feb. 18, 2009    (EP) .................................... 09153091

(51) Int. Cl.
*H01L 21/00* (2006.01)
*H01L 21/20* (2006.01)

(52) U.S. Cl. ............ 438/3; 438/104; 438/171; 438/260; 438/666; 365/148; 365/171; 257/9; 257/295; 257/310; 257/314; 257/E21.002; 257/E21.004; 257/E21.663; 257/E27.004; 257/E45.002

(58) Field of Classification Search ............... 438/3, 104, 438/171, 260, 666; 365/148, 171; 257/9, 257/295, 310, 314, E21.002, E21.004, E21.663, 257/E27.004, E45.002
See application file for complete search history.

(56) References Cited

U.S. PATENT DOCUMENTS

| 7,807,478 | B2 * | 10/2010 | Kim | 438/3 |
| 7,881,092 | B2 * | 2/2011 | Ufert | 365/148 |
| 2002/0058389 | A1 * | 5/2002 | Wicker | 438/381 |
| 2005/0122771 | A1 | 6/2005 | Chen | |
| 2006/0054950 | A1 * | 3/2006 | Baek et al. | 257/295 |
| 2006/0170027 | A1 * | 8/2006 | Lee et al. | 257/314 |
| 2007/0111429 | A1 | 5/2007 | Lung | |
| 2009/0016094 | A1 * | 1/2009 | Rinerson et al. | 365/148 |

FOREIGN PATENT DOCUMENTS

| WO | 03/021693 | 3/2003 |
| WO | 2008/026081 | 3/2008 |
| WO | 2008/078197 | 7/2008 |

OTHER PUBLICATIONS

European Search Report, European Patent Application 09153091.5 dated Jul. 15, 2009.

* cited by examiner

*Primary Examiner* — Dao H Nguyen

(74) *Attorney, Agent, or Firm* — McDonnell Boehnen Hulbert & Berghoff LLP

(57) ABSTRACT

A method for manufacturing a resistive switching memory device comprises providing a substrate comprising an electrical contact, providing on the substrate a dielectric layer comprising a trench exposing the electrical contact, and providing in the trench at least the bottom electrode and the resistive switching element of the resistive memory device. The method may furthermore comprise providing a top electrode at least on or in the trench, in contact with the resistive switching element. The present invention also provides corresponding resistive switching memory devices.

12 Claims, 18 Drawing Sheets

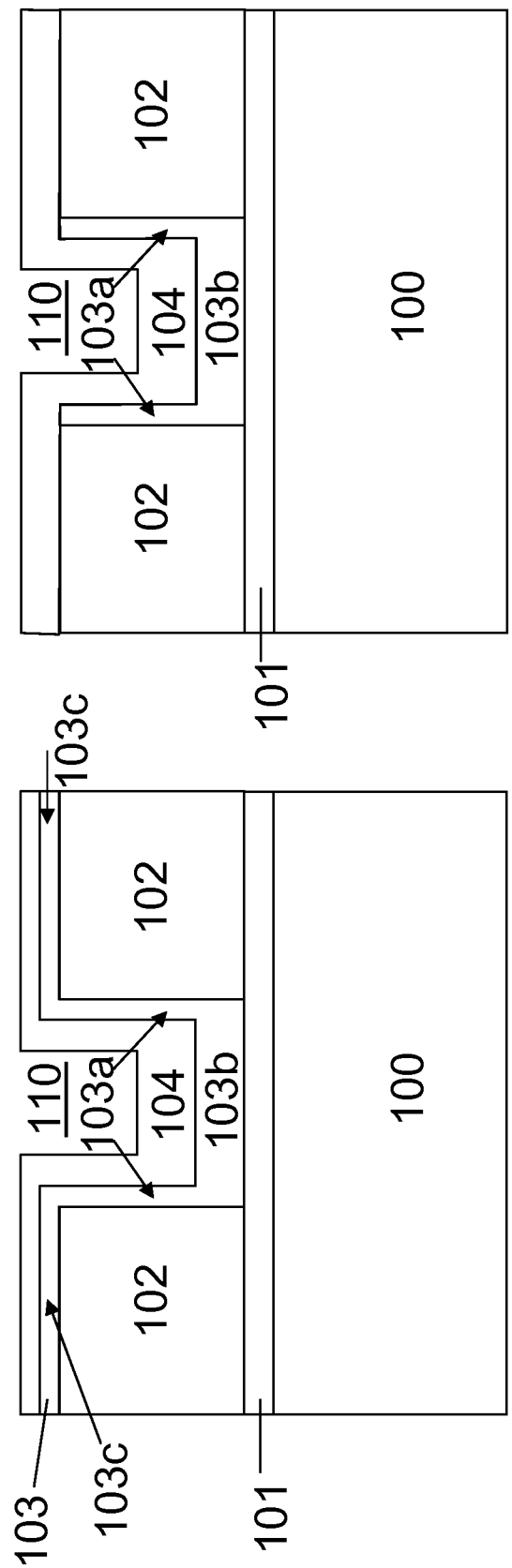

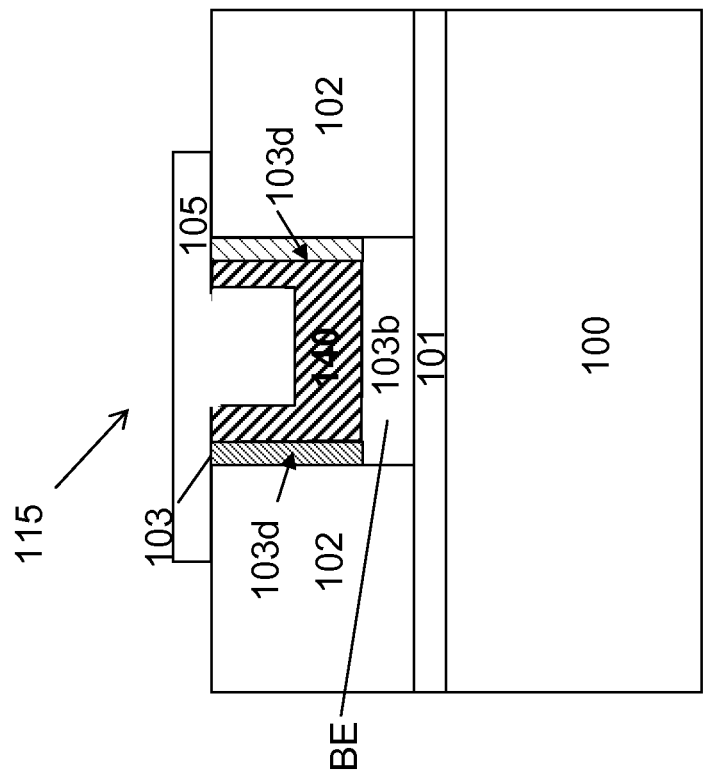
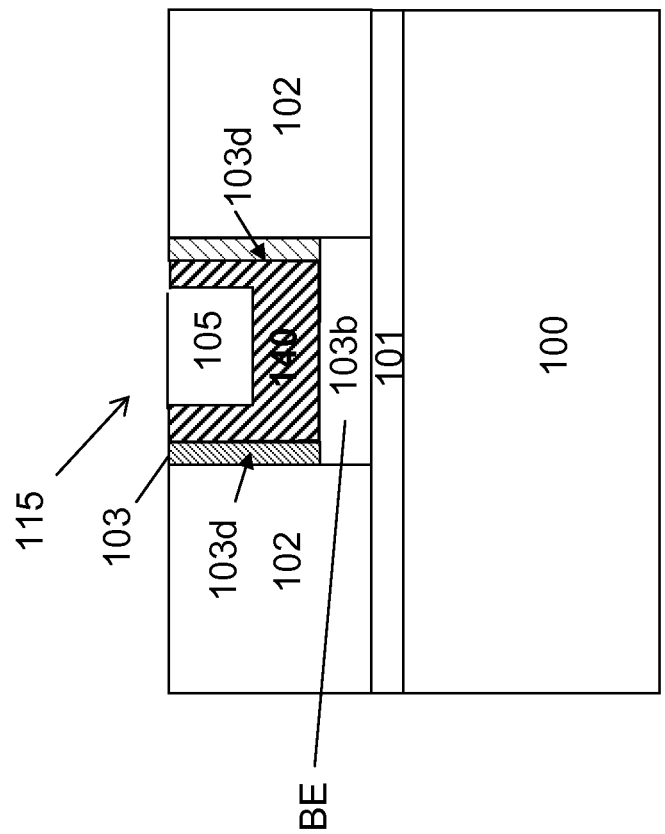

METHOD FOR MANUFACTURING A RESISTIVE SWITCHING MEMORY DEVICE AND DEVICES OBTAINED THEREOF

CROSS REFERENCE TO RELATED APPLICATIONS

This application claims priority to U.S. Provisional Patent Application Ser. No. 61/140,762 filed on Dec. 24, 2008, and European Patent Application No. 09153091.5 filed on Feb. 18, 2009, the contents of which are incorporated by reference herein in its entirety.

FIELD OF THE INVENTION

The present invention generally relates to methods for manufacturing nonvolatile memory devices. More specifically it relates to methods for manufacturing resistive memory devices and to nonvolatile resistive memory devices thus manufactured.

BACKGROUND OF THE INVENTION

The evolution of the market of data storage memories indicates a growing need for ever-larger capacity, ranging from gigabytes to hundreds of gigabytes or even to terabytes. This evolution is driven, amongst others, by new data consuming applications such as multimedia and gaming. Flash memory technology, for example, which uses the shift in threshold voltage of a field effect transistor to indicate bit status, has so far been able to fulfil this scaling requirement, keeping a reasonable cost per bit. However it is expected that Flash memory technology will face severe scaling problems beyond the 45 nm technology node due to fundamental physical and/or cost limitations.

Resistive switching memories constitute replacement candidates, as their physical switching mechanism may not degrade with scaling. These types of memories comprise a resistor element that can be reversibly programmed in either a high or a low conductive state. Various materials such as transition metal oxides, organic semiconductors or organometallic semiconductors can be used to manufacture such resistor elements.

A resistive switching memory is based on the switching of the resistance. A material or device with switchable resistance value is placed between two electrodes. Switching is done by applying a voltage exceeding a threshold for changing the resistance (i.e. from low to high or vice versa). The memory cell may then be read by measuring the resistance value.

Resistive switching memories could potentially provide greater density, lower power usage, greater speed, and lower cost than Flash memory.

Resistive switching memories are being integrated using structures derived from the 1T/1R (one transistor/one resistor) and 1D/1R (one diode/one resistor) concept as used in dynamic RAM. The resistor element, comprising the resistive switching material, is stacked on top of a semiconductor device such as a MOS transistor, a bipolar transistor, or a diode, and is accessed through a bit-line. The resistor element is placed between metal lines or between the contact to the transistor and first metal level, typically within the back-end-of-line (BEOL) section of the integrated circuit.

The resistive memory device is integrated after the production of the transistors (i.e. after the front-end-of-line processes (FEOL)) and before the completion of the full interconnect stack (i.e. before the completion of the back-end-of-line processes (BEOL)).

PCT patent application WO2008/026081 discloses a method for manufacturing resistive switching devices. The resistive switching device comprises a bottom electrode, a top electrode and a layer of resistive switching material contacted by the bottom electrode and the top electrode. For forming the resistive switching device a dielectric layer is formed on a substrate, the substrate comprising the bottom electrode. In the dielectric layer a trench opening is formed so as to expose the bottom electrode. A resistive material is formed in the opening. The top electrode is formed on top of this resistive material.

There is a continuous need for a method to form a resistor element comprising a resistive switching layer, which method allows further scaling of resistor arrays.

There is also a need for a method to form a resistor element comprising a resistive switching layer, which would facilitate the integration of resistive switching materials in CMOS compatible process flows.

SUMMARY OF CERTAIN INVENTIVE ASPECTS

In a first aspect, the present invention relates to a method for manufacturing a resistive switching memory device.

One inventive aspect relates to a method for manufacturing a resistive memory device, the resistive memory device comprising a top electrode, a bottom electrode and a resistive switching element. The method comprises providing a substrate comprising an electrical contact, providing on the substrate a dielectric layer comprising a trench exposing the electrical contact, and providing in the trench at least the bottom electrode and the resistive switching element of the resistive memory device. The method may furthermore comprise providing the top electrode at least on or in the trench, in contact with the resistive switching element.

In a method according to embodiments of the present invention the trench in the dielectric layer may comprise at least one sidewall surface and a bottom surface. Providing in the trench at least the bottom electrode and the resistive switching element may comprise forming a conductive liner, i.e. a conductive layer, on the at least one sidewall surface and the bottom surface of the trench, thereby only partially filling the trench as such leaving a cavity in the trench, the conductive layer comprising a sidewall conductive layer in contact with the at least one sidewall surface of the trench and a bottom conductive layer in contact with the bottom surface of the trench; modifying the conductive properties of at least part of the sidewall conductive layer; the bottom electrode comprising the bottom conductive layer and, if present, the unmodified part of the sidewall conductive layer; and forming the resistive switching element in at least part of the cavity of the trench, the resistive switching element being in contact with the bottom conductive layer and in contact with at least part of the sidewall conductive layer.

Forming the resistive switching element may comprise providing a resistive layer in the at least part of the cavity of the trench.

According to embodiments of the present invention, providing a resistive layer in at least part of the cavity of the trench may comprise depositing a starting material, e.g. a metal layer, in at least part of the cavity of the trench, and transforming the starting material into a switching material, e.g. oxidizing the metal layer, thereby forming a metal-oxide material, the resistive switching element consisting of the metal-oxide material. In particular embodiments of the invention, the process which transforms the starting material into a switching material at the same times electrically breaks up the conductive liner so that no conductive path exists from the bottom conductive layer over the sidewall conductive layer towards a top electrode still to be formed.

The metal layer may comprise a transition metal to be converted by oxidation into a transition-oxide metal. In particular embodiments, the resistive layer may comprise a metal chosen from Ni, Ti, Cu, W.

Modifying the conductive properties of at least part of the sidewall conductive layer may comprise converting the conductive properties of at least part of the sidewall conductive layer into dielectric properties.

By modifying the conductive properties of at least part of the sidewall conductive layer, the sidewall conductive layer comprises at least a modified sidewall conductive layer. If only part of the sidewall conductive layer is modified, the sidewall conductive layer also comprises an unmodified sidewall conductive layer. Said unmodified sidewall conductive layer forms than part of the bottom electrode together with the bottom conductive layer.

Converting the conductive properties of at least part of the sidewall conductive layer into dielectric properties may comprise oxidation of at least part of the sidewall conductive layer.

According to embodiments of the present invention, modifying the conductive properties of at least part of the sidewall conductive layer may occur before the step of forming the resistive switching element.

According to embodiments of the present invention, the sidewall conductive layer may have a thickness Ts and the bottom conductive layer may have a thickness Tb, whereby Ts is equal to or smaller than Tb. In particular embodiments, Ts is smaller than Tb, for example Ts may be smaller than or equal to 10 nanometers, down to the thickness of a few atomic layers. This thickness may be achieved by forming the conductive layer using a non-conformal deposition technique with good bottom-top coverage without significant sidewall deposition. Forming the conductive layer may for example be done using ion metal plasma deposition or self-ionized plasma sputtering.

Modifying the conductive properties of at least part of the sidewall conductive layer may comprise an oxidation step using plasma oxidation.

Modifying the conductive properties of at least part of the sidewall conductive layer may occur upon the formation of the sidewall conductive layer. This is during or immediately after the formation of the sidewall conductive layer. This may in particular be done for a sidewall conductive layer with a thickness Ts smaller than or equal to 10 nanometers, for example smaller or equal to 5 nanometers, down to the thickness of a few atomic layers.

Alternatively, modifying the conductive properties of at least part of the sidewall conductive layer may also occur during the step of providing a resistive layer, for example during oxidizing the metal thereby forming a metal-oxide material. This may for example be done for a sidewall conductive layer with a thickness Ts which is larger than 10 nanometers. Such a thickness may be achieved by using ALD or CVD for forming the conductive layer. This has the advantage that no separate step needs to be carried out for modifying the conductive properties of at least part of the sidewall conductive layer.

The sidewall conductive layer may comprise any metal selected from Ti, Ta, Ni, TaN, TiN or a combination thereof.

Forming the top electrode may comprise depositing a conductive layer, e.g. a layer comprising a metal in contact with the resistive switching element and part of the conductive layer.

The top electrode may comprise a metal selected from Ni, Ti, TiN, Pt, Au, noble metals, Ru, Ir, IrO2, RuO, TaC(N) or any combination made thereof.

In embodiments of the present invention, the electrical contact may be a diode contact. In alternative embodiments, the electrical contact may be a source/drain electrical contact.

In a second aspect, the present invention relates to a resistive memory device comprising a top electrode, a bottom electrode and a resistive switching element, wherein the bottom electrode and the resistive switching element are provided in a single trench in a dielectric material. According to embodiments of the present invention, the trench may have at least one sidewall surface, and the resistive memory device may further comprise a non-conductive layer at at least part of the at least one sidewall surface of the trench, the non-conductive layer being in contact with the bottom electrode and the resistive switching element. The bottom electrode comprises a conductive material which may be a metal. The non-conductive layer may comprise the same metal as the bottom electrode. In particular embodiments, the non-conductive layer may comprise a metal-oxide layer wherein the metal is the same as the metal of the bottom electrode. In particular embodiments, the non-conductive layer has a thickness smaller than 10 nm, for example smaller than 5 nm, down to a thickness of a few atomic layers.

A single resistive memory device or an array of resistive memory devices may be formed using the method for manufacturing a resistive memory device according to embodiments of the present invention.

In a further aspect, the present invention relates to the use of the method for manufacturing a resistive memory device according to embodiments of the present invention in the manufacturing process of a 1T/1R RAM device.

In a further aspect, the present invention relates to the use of the method for manufacturing a resistive memory device according to embodiments of the present invention in the manufacturing process of a 1D/1R RAM device.

In a further aspect, the present invention relates to the use of the method for manufacturing a resistive memory device according to embodiments of the present invention in the manufacturing process of multi-dimensional stacked memory device.

It is an advantage of embodiments of the present invention that a resistor element comprising a resistive switching layer may be manufactured which is scalable for at least several technology generations from the 45 nm CMOS node and beyond.

It is another advantage of embodiments of the present invention that the resistive memory element is directly stacked on top of the transistor. The resistive memory element is thus preferably formed at the M0 wiring local interconnect level, i.e. using the first contact to the transistor. Thereby higher integration densities are possible compared to the higher metal interconnect levels.

It is another advantage of embodiments of the present invention that a resistive memory device may be manufactured using technology and materials which are compatible with present and future generations of CMOS. The method according to embodiments of the present invention facilitates the integration of resistive switching materials in CMOS compatible process flows, more specifically in the CMOS compatible back-end-of-line (BEOL) processes.

It is another advantage of embodiments of the present invention that nonvolatile memory devices may be manufactured which allow integration into different memory architectures that can lead to different memory products and applications.

BRIEF DESCRIPTION OF THE DRAWINGS

All drawings are intended to illustrate some aspects and embodiments of the present invention. The drawings described are only schematic and are non-limiting. In the drawings, the size of some of the elements may be exaggerated and not drawn on scale for illustrative purposes.

Exemplary embodiments are illustrated in referenced figures of the drawings. It is intended that the embodiments and figures disclosed herein be considered illustrative rather than restrictive. In the different figures, the same reference signs refer to the same or analogous elements.

FIG. 1-FIG. 12 show a schematic representation of different process steps for manufacturing a resistive switching memory device according to embodiments of the present invention.

DETAILED DESCRIPTION OF CERTAIN ILLUSTRATIVE EMBODIMENTS

Figure 1:
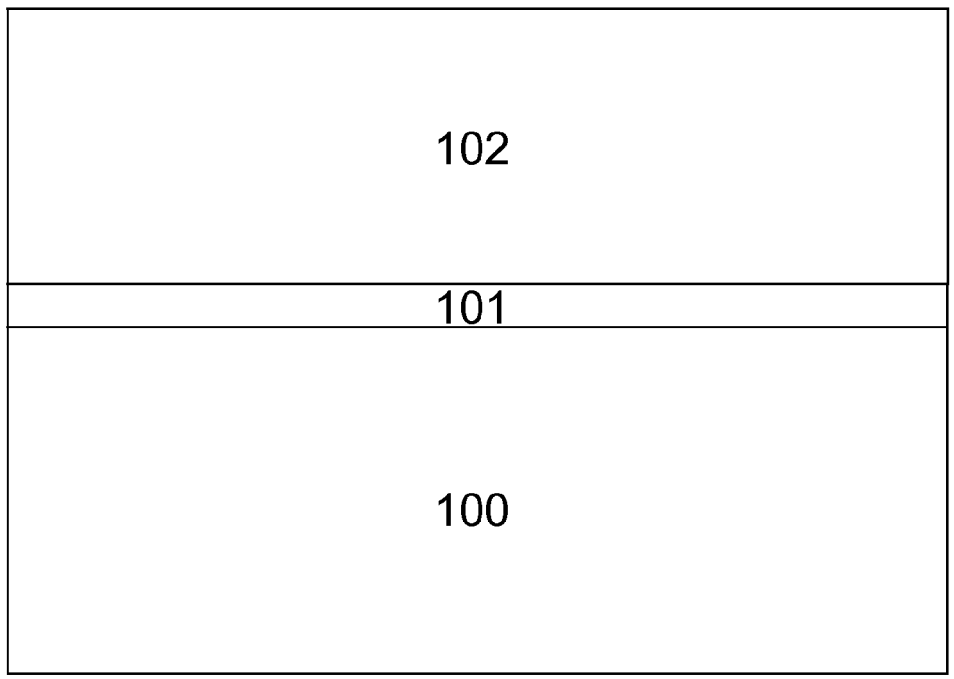

One or more embodiments of the present invention will now be described in detail with reference to the attached figures; the invention is, however, not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice. Those skilled in the art can recognize numerous variations and modifications that are encompassed by the scope of the invention. Accordingly, the description of preferred embodiments should not be deemed to limit the scope of the present claims.

Furthermore, the terms first, second and the like in the description are used for distinguishing between similar elements and not necessarily for describing a sequential or chronological order. It is to be understood that the terms so used are interchangeable under appropriate circumstances and that the embodiments described herein are capable of operation in other sequences than described or illustrated herein.

Moreover, the terms top, bottom, over, under and the like in the description are used for descriptive purposes and not necessarily for describing relative positions. The terms so used are interchangeable under appropriate circumstances and the embodiments described herein can operate in other orientations than described or illustrated herein. For example "underneath" and "above" an element indicates being located at opposite sides of this element.

Reference throughout this specification to "one embodiment" or "an embodiment" means that a particular feature, structure or characteristic is described in connection with the embodiment. Inventive aspects may lie in less than all features of a single foregoing disclosed embodiment.

In the description provided herein, numerous specific details are set forth. However, it is understood that embodiments may be practiced without these specific details. In other instances, well-known methods, structures and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 25% of the exact stoichiometric number are comprised in the chemical name or formula, for the present purposes. Where an algebraic subscript is given, then variations in the range of about plus/minus 25% are comprised relative to the value of each subscript. Such varied values do not necessarily sum to a whole number and this departure is contemplated. Such variations may occur due to either intended selection and control of the process conditions, or due to unintended process variations.

The following terms are provided solely to aid in the understanding of the embodiments.

In the following, certain embodiments will be described with reference to a silicon (Si) substrate but it should be understood that these embodiments apply equally well to other semiconductor substrates. In embodiments, the "substrate" may include a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a silicon dioxide ($SiO_2$) or a silicon nitride ($Si_3N_4$) layer in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer.

In embodiments, methods are disclosed for manufacturing a resistive memory device. A resistive memory device such as for example a resistive random access memory device (RRAM) comprises a resistive memory element comprising a resistive-switching layer sandwiched in between a top electrode and a bottom electrode thereby forming a Metal-Insulator-Metal (MIM) structure. The electrodes allow applying electrical signals, e.g. voltages or currents, to the resistive-switching layer during operation of the memory cell, e.g. for programming, erasing or reading thereof.

Figure 18:
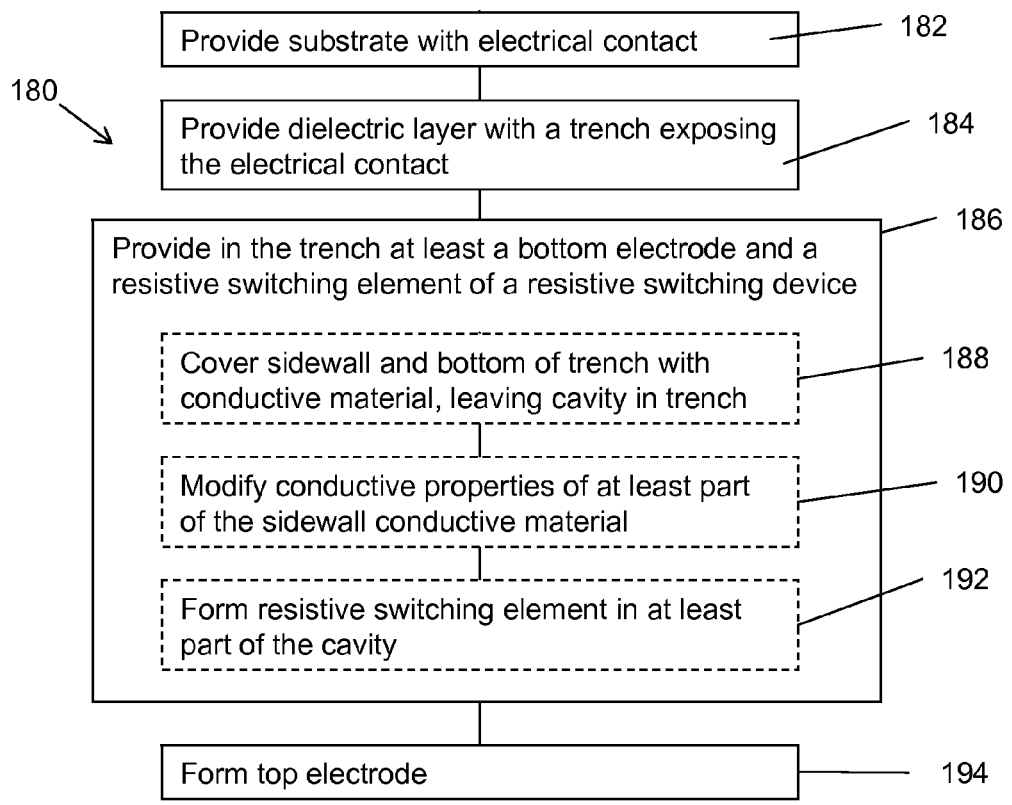
FIG. 18 is a flow chart illustrating a method according to embodiments of the present invention.

According to a first aspect of the present invention, a method is disclosed for manufacturing a resistive memory device, the resistive memory device comprising a top electrode, a bottom electrode and a resistive switching element. The method 180 comprises providing a substrate comprising an electrical contact (step 182 in FIG. 18), providing on the substrate a dielectric layer comprising a trench exposing the electrical contact (step 184 in FIG. 18), and providing in the trench at least the bottom electrode and the resistive switching element of the resistive memory device (step 186 in FIG. 18).

In embodiments of the present invention, the method 180 comprises providing a dielectric layer on an electrical contact, the electrical contact formed on a substrate; providing 184 a trench in the dielectric layer, the trench comprising at least one sidewall surface and a bottom surface, the trench exposing the electrical contact; forming 188 a conductive layer on the at least one sidewall surface and the bottom surface of the trench thereby only partially filling the trench, as such leaving a cavity in the trench, the conductive layer comprising a sidewall conductive layer in contact with the at least one sidewall surface of the trench and a bottom conductive layer in contact with the bottom surface of the trench; modifying 190 the conductive properties of at least part of the sidewall conductive layer, the bottom electrode comprising the bottom conductive layer and the unmodified part of the sidewall conductive layer; forming 192 the resistive switching element in at least part of the cavity of the trench, the resistive switching element being in contact with the bottom conductive layer and in contact with at least part of the sidewall conductive layer; and forming 194 a top electrode in contact with the resistive switching element.

With reference now to FIG. 1 to FIG. 18 different embodiments are illustrated in more detail.

Electrical Contact

An electrical contact 101 is provided on a substrate 100 (FIG. 1). The substrate 100 can be a semiconductor-based substrate such as e.g. a silicon-based substrate, for example a bulk silicon wafer or a silicon-on-insulator (SOI) substrate. In particular embodiments the substrate 100 is a semiconductor substrate comprising active elements such as diodes and/or transistors such as field effect transistors or bipolar transistors.

The electrical contact 101 may be made from any type of conductive material, for example metallic material. Depending on the conductive material used, it may be provided for example by depositing, e.g. by chemical vapour deposition, physical vapour deposition, electrochemical deposition, molecular beam epitaxy, atomic layer deposition, or by sputtering.

Figure 13:
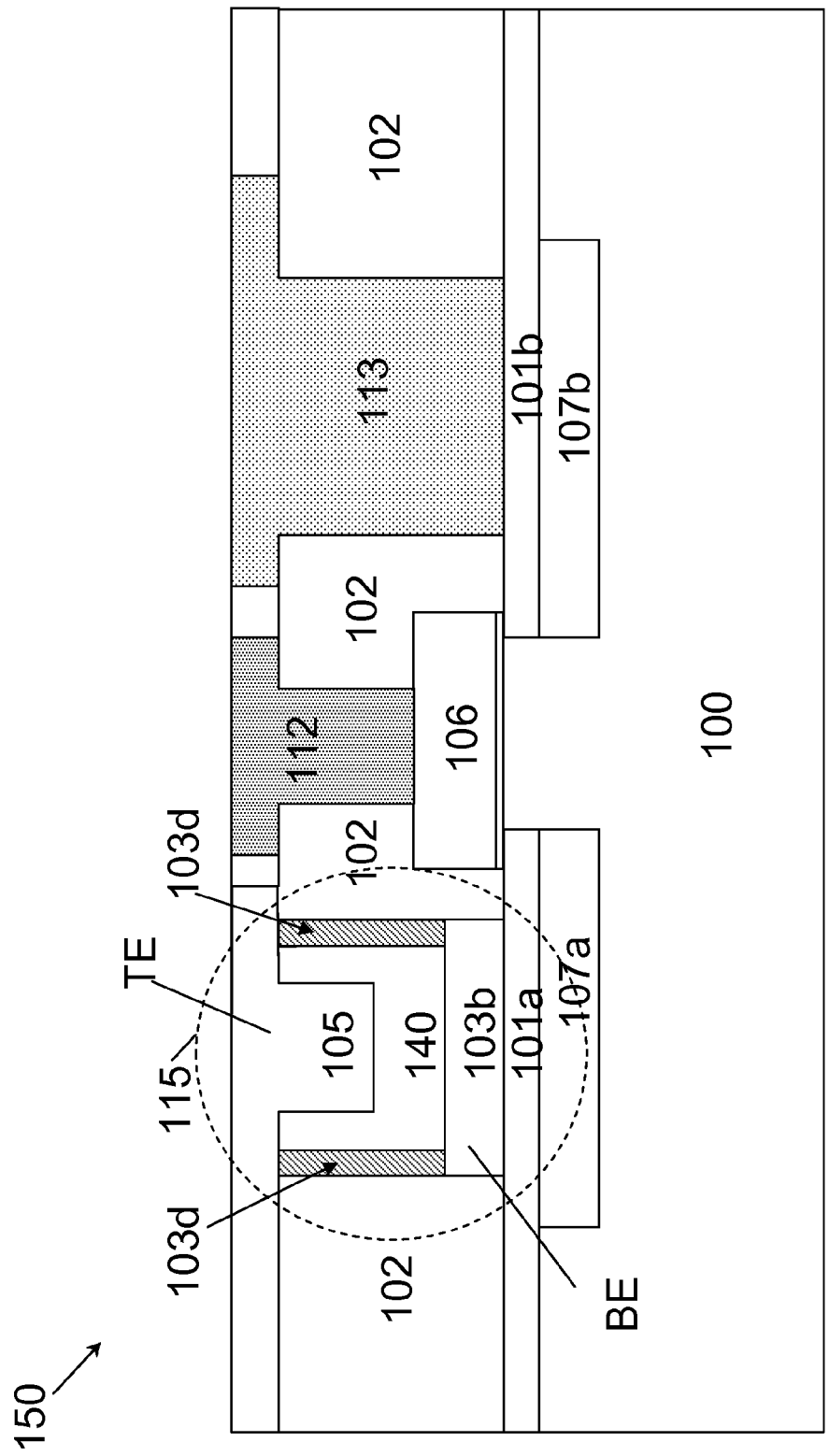
FIG. 13 shows a schematic representation of a possible 1T/1R integration scheme, i.e. incorporating a resistive switching memory element manufactured according to an embodiment of the present invention into a semiconductor device.

In use of the resistive switching device, the electrical contact 101 allows current to pass from the substrate 100 to the resistive memory element. In embodiments of the present invention, the electrical contact 101 may be a diode contact (as typically used for a 1D/1R memory device). The electrical contact 101 may be a source/drain junction contact, the source/drain junction contact being part of a transistor (as typically used for a 1T/1R memory device). The source/drain junction contact 101 may be a silicide formed on the source/drain junction regions 107 as also shown in FIG. 13. The electrical contact may comprise a metal silicide such as for example NiSi, TiSi, CoSi.

Dielectric Layer

A dielectric layer 102 is provided on and in contact with the electrical contact 101 (FIG. 1). The dielectric layer 102 is preferably a pre-metal dielectric (PMD) layer (also known as poly-metal dielectric or sometimes mentioned more general as intermetal dielectric (IMD)) which forms part of the back-end-of-line (BEOL). The dielectric layer 102 may comprise the first level of an interconnect structure and serves to isolate the first metal interconnect from the underlying substrate 100 (and electrical contact 101). The dielectric layer 102 may consist of a single dielectric layer or a stack of dielectric layers. The material of the dielectric layer 102 can be any dielectric used in semiconductor processing such as for example silicon oxide, silicon oxide carbide, low-k materials such as porous oxides, silicon nitride, spin-on-glass such as phosphosilicate glass (Psi) or boron phosphosilicate glass (BPSG). The dielectric layer 102 may be deposited by any suitable deposition technique well known for a person skilled in the art such as chemical-vapour-deposition (CVD) or plasma-enhanced CVD (PECVD) or by coating e.g. spin-coating. The thickness of the dielectric layer 102 may be in the range of 100 nm to 1000 nm, more preferably in the range of 400 nm-500 nm. The thickness of the dielectric layer 102 is preferably comparable to the thickness typically used in semiconductor back-end-of-line (BEOL) processing for the first metal interconnect layer (PMD layer). In this dielectric layer 102 at least part of the resistive memory device will be formed.

Trench/Via Formation

Figure 2:
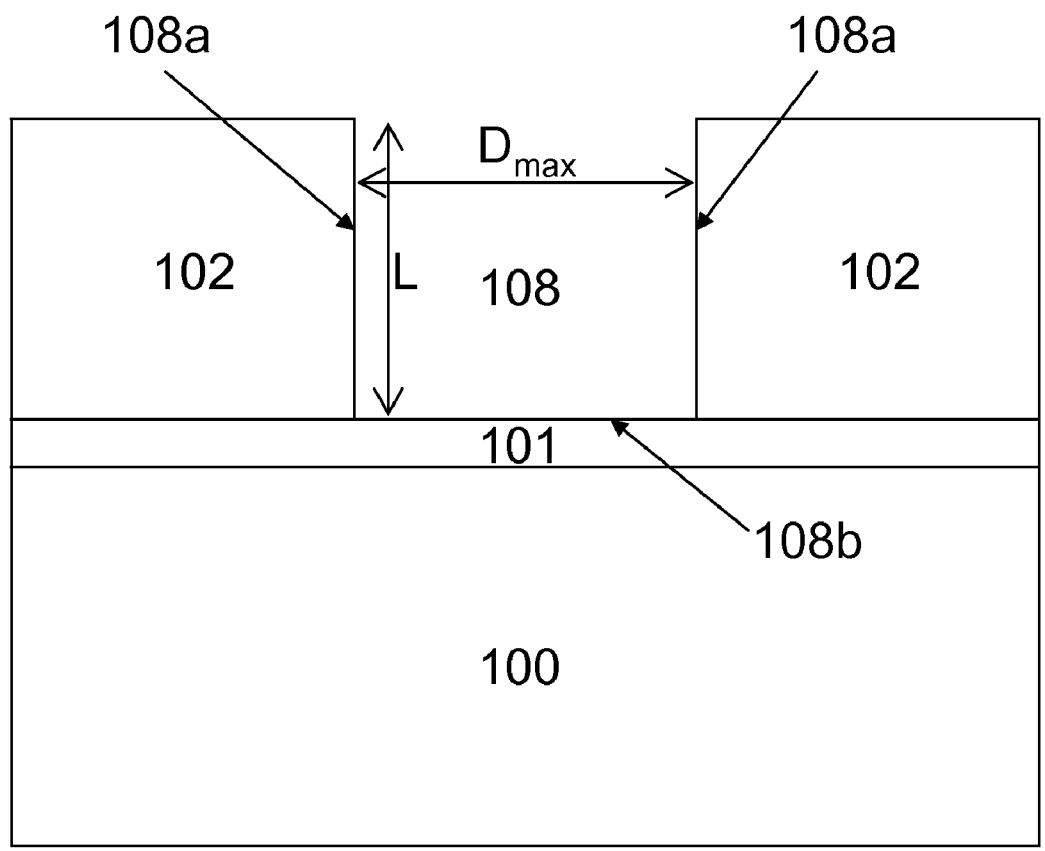

For forming the resistive memory device 115, at least one trench or via or cavity 108 is provided in the dielectric layer 102 thereby exposing at least part of the underlying electrical contact 101 (FIG. 2). The trench or via or cavity 108 may be formed in any suitable way, for example by etching the dielectric layer 102 in accordance with the pattern and the dimensions of the resistive memory device to be formed. The patterned dielectric layer is thus completely opened towards the electrical contact layer, as such exposing the underlying electrical contact 101. The trench 108 may have any suitable shape in cross-section substantially parallel with the plane of the electrical contact, for example, but not limited thereto, circular, oval, square, rectangular, polygonal. The trench comprises a bottom surface 108b and one or more sidewall surfaces 108a. The depth of the trench 108 is defined by the thickness of the dielectric layer 102. The thicker the dielectric layer 102, the deeper the trench 108. The trench 108 is defined by its depth or length L, its maximal diameter Dmax and its minimal diameter Dmin. The maximal diameter Dmax is the maximum width or diameter of the trench 108, while the minimal diameter Dmin is the minimal width or diameter of the trench 108. The maximal diameter Dmax is larger than or equal to the minimal diameter Dmin. If the trench 108 has for example a cylindrical or cubic shape Dmax equals Dmin. If the trench 108 has for example a conical shape, Dmax is larger than Dmin. The depth or length L of the trench 108 is preferably larger than the maximal diameter Dmax of the trench, more preferably at least 2 times larger than the maximal diameter Dmax of the trench. The aspect ratio, i.e. the ratio of the depth or length L of the trench to the maximal diameter Dmax is preferably larger than 2.

The maximal diameter Dmax of the trench 108 defines the scalability of the resistive memory device that will be formed. The maximal diameter Dmax of the trench 108 is preferably smaller than 150 nm, even more preferably smaller than 90 nm. The diameters Dmax and Dmin define the contact size of the resistive memory device with the top and bottom electrode. For example for a 45 nm technology node the contact size is about 50 nm.

Conductive Layer Formation

Figure 3:
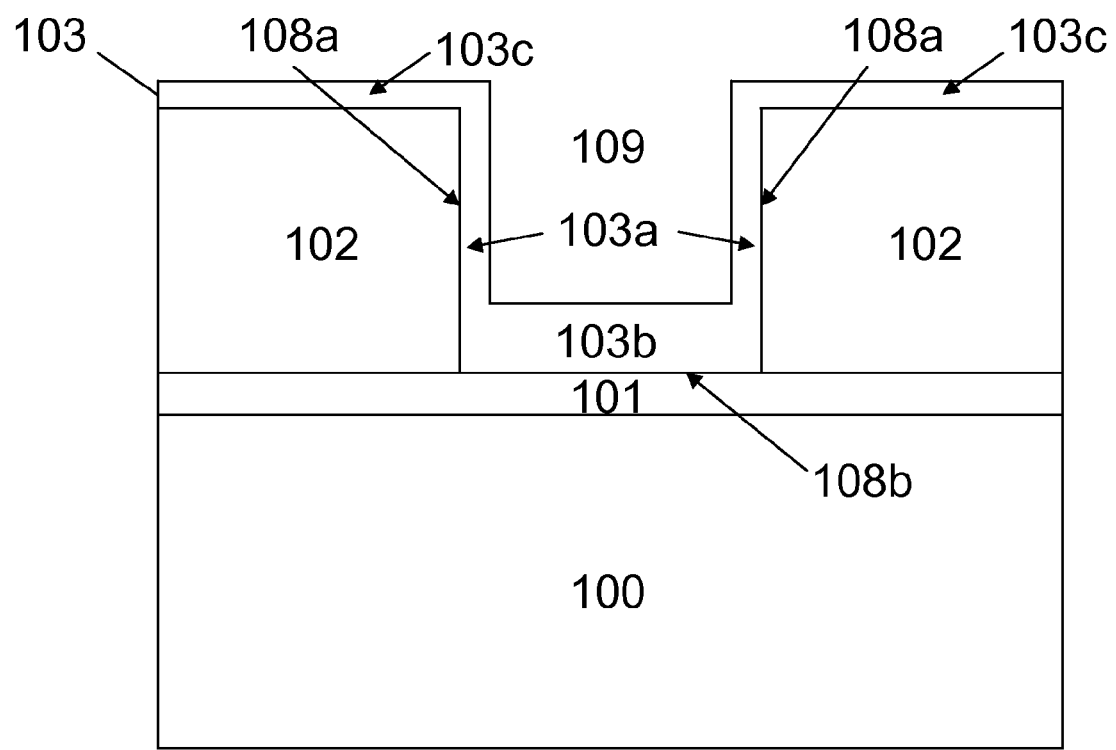
Figure 4B:
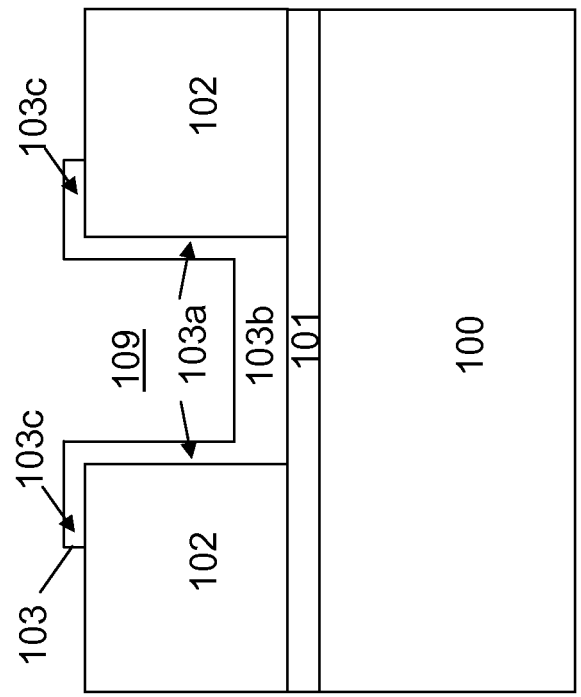
Figure 4A:
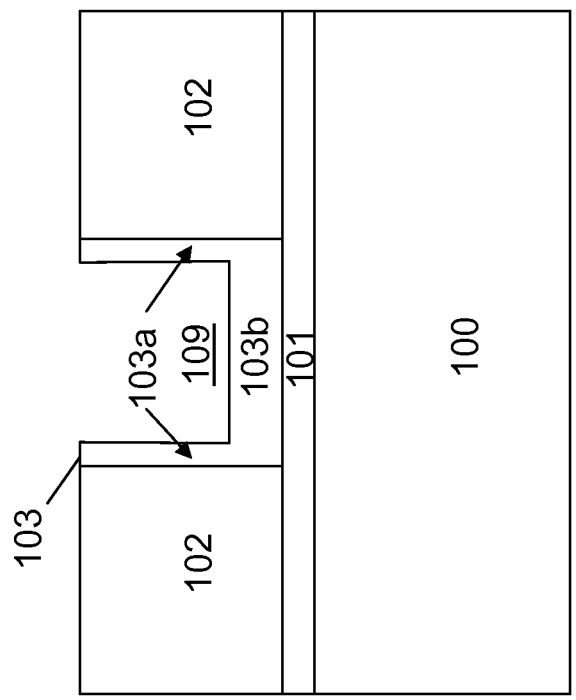

After formation of the trench 108 a conductive layer 103 is formed on the sidewall surface(s) 108a and the bottom surface 108b of the trench 108, thereby only partially filling the trench, thus leaving a cavity 109 in the trench 108 (FIG. 3).

The conductive layer 103 may be formed overlying the patterned dielectric layer 102. As such the conductive layer 103 comprises a sidewall conductive layer 103a in contact with the sidewall surfaces 108a of the trench and a bottom conductive layer 103b in contact with the bottom surface 108b of the trench (FIG. 3). The conductive layer 103 may also comprise a top conductive layer 103c in contact with the top surface of the dielectric layer 102 adjacent to the trench 108.

The top conductive layer 103c may be completely (FIG. 4A) or partially (FIG. 4B) removed from the top surface of the dielectric layer 102. A complete removal of the top conductive layer 103c, i.e. the part of the conductive layer 103 present outside the trench 108, may be done for example by polishing, such as chemical polishing (CP) or chemical-mechanical polishing (CMP) or etch-back. A partial removal of the top conductive layer 103c may be done by patterning of the conductive layer 103 such that only part of the top conductive layer 103c remains available outside the trench 108 on top of the dielectric layer 102. This step of partially or completely removing the top conductive layer 103c may be done prior to the formation of the resistive switching element or after the formation of the resistive switching element. This step of partially or completely removing the top conductive layer 103c may also be done prior to the formation of the top electrode or after the formation of the top electrode.

Figure 5B:
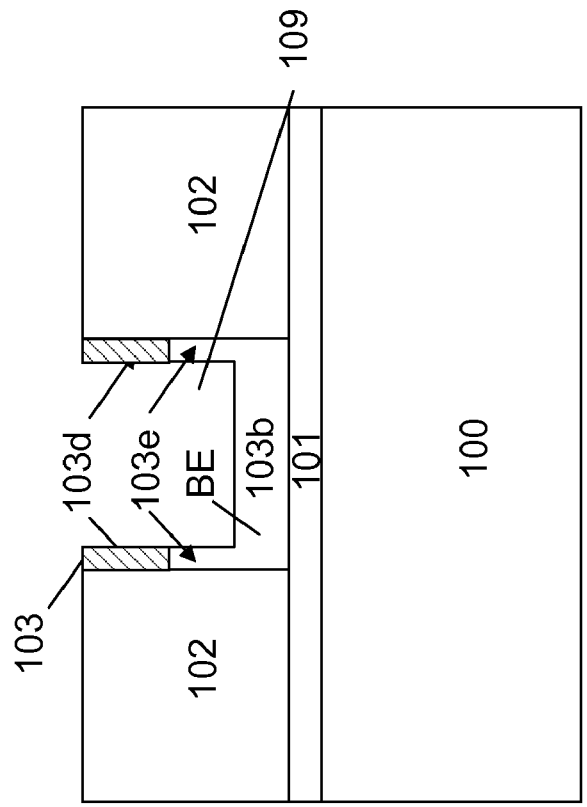
Figure 5A:
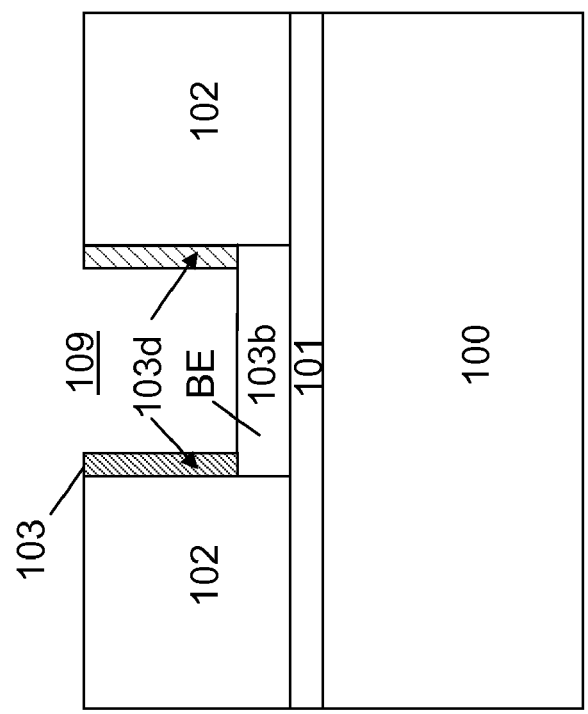

According to an embodiment of the present invention, only the bottom conductive layer 103b defines the bottom electrode BE of the resistive memory device (FIG. 5A). In this case neither the sidewall conductive layer 103a nor the top conductive layer 103c form part of the bottom electrode BE of the resistive memory device. Stated in other words, the sidewall conductive layer 103a and (if present) the top conductive layer 103c do not electrically contribute when operating the resistive memory device. In order to have no electrical contribution of the sidewall conductive layer 103a and the top conductive layer 103c, the conductive properties of the sidewall conductive layer 103a and the top conductive layer 103c (if present) should be modified.

According to another embodiment, the bottom electrode BE is defined by the bottom conductive layer 103b and by part of the sidewall conductive layer 103e (FIG. 5B). Stated in other words, part 103e of the sidewall conductive layer 103a, which is an extension of the bottom conductive layer 103b, forms part of the bottom electrode BE together with the bottom conductive layer 103b. The remaining part 103d of the sidewall conductive layer 103a does not form part of the bottom electrode BE. Also the top conductive layer 103c, if present, does not form part of the bottom electrode BE of the resistive memory element. Otherwise said, the remaining part 103d of the sidewall conductive layer 103a and (if present) the top conductive layer 103c do not electrically contribute when operating the resistive memory device. In order to have no electrical contribution of the remaining part 103d of the sidewall conductive layer 103a and the top conductive layer 103c, the conductive properties of the remaining part 103d of sidewall conductive layer 103a and the top conductive layer 103c should be modified. As such a modified sidewall conductive layer 103d and modified top conductive layer are formed.

In embodiments of the present invention, the conductive layer 103 comprises a metal layer or a stack of metal layers. The metal used may be a transition metal or transition metal nitride. Most preferably the conductive layer 103 comprises any metal selected from Ti, Ta, Ni, TaN or TiN or a combination thereof such as stack combinations Ti/TiN or Ta/TaN. The conductive layer 103 for example may be formed by first forming a Ti layer and then forming a TiN layer over the Ti layer. The metal of the conductive layer should have good adhesion properties with the dielectric layer 102 at the sidewall surface(s) 108a of the trench 108.

The conductive layer 103 may be formed using deposition techniques which are typically used for barrier and/or seed layer deposition (also often called liner deposition) in trenches or vias well known to a person skilled in the art in back-end-of-line (BEOL) semiconductor processing.

Figure 6B:
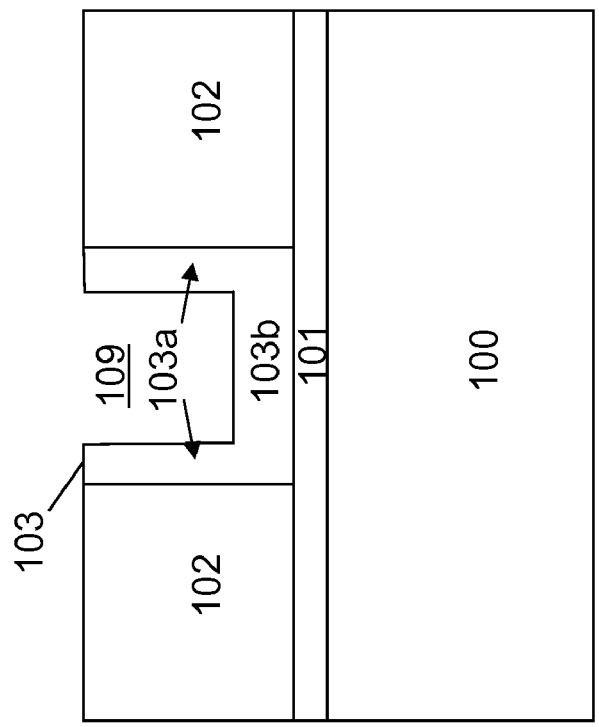
Figure 6A:
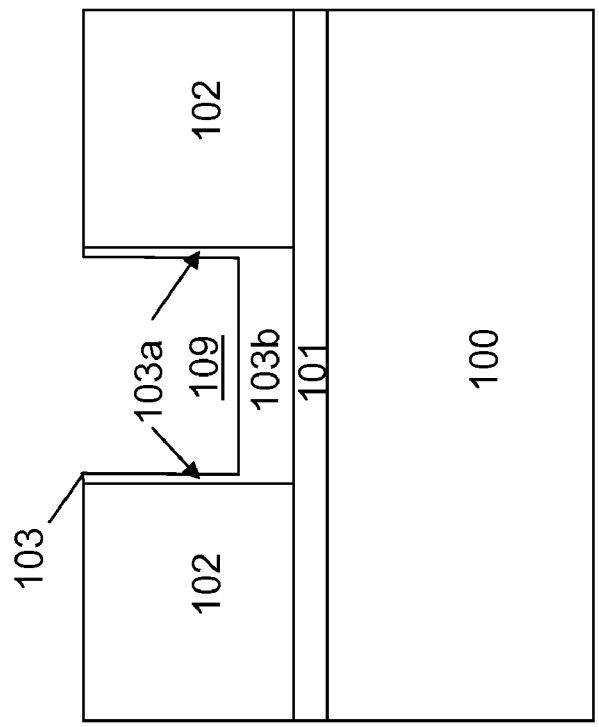

According to an embodiment, the conductive layer 103 is formed using a deposition technique which enables the formation of a much thinner conductive layer at the sidewall surface(s) 108a of the trench 108 compared to the conductive layer at the bottom surface 108b of the trench 108 (FIG. 6A). More specifically, a non-conformal deposition technique which improves top and bottom coverage of the trench or via without significant sidewall deposition may be used. In this embodiment, sidewall coverage is marginal. Examples of such deposition techniques are ion metal plasma deposition (IMP) or self-ionized plasma sputtering (SIP).

According to another embodiment, a more conformal deposition technique may be used for forming the conductive layer 103 in the trench 108, such as for example atomic layer deposition (ALD) or chemical vapour deposition (CVD). These deposition techniques improve top, bottom and sidewall coverage in the trench 108. By using such a conformal deposition technique the thickness of the sidewall conductive layer 103a will be comparable to the thickness of the bottom conductive layer 103b (and top conductive layer 103c if present) (FIG. 6B)).

For the definition of the bottom electrode, as described above in accordance with FIG. 5A and FIG. 5B, the thickness of the conductive layer 103 and more specifically the thickness of the sidewall conductive layer 103a, 103d, 103e is a relevant parameter. The thickness of the conductive layer at the sidewall surface 108a of the trench 108 (sidewall conductive layer 103a) should be such that at least part of the sidewall conductive layer, i.e. dashed areas in FIG. 5A, FIG. 5B, does not contribute electrically when operating the resistive memory device. According to an embodiment, the complete sidewall conductive layer 103a does not form part of the bottom electrode BE (FIG. 5A). According to another embodiment the modified part 103d of the sidewall conductive layer 103a after modification of its conductivity properties does not form part of the bottom electrode BE (FIG. 5B). Otherwise said, the final sheet resistance of the complete sidewall conductive layer 103a or of at least part 103d of the sidewall conductive layer, i.e. dashed areas in FIG. 5A or FIG. 5B, should be high enough such that no electrical conduction is possible in between the bottom electrode BE (consisting of the bottom conductive layer 103b or consisting of the bottom conductive layer 103b and the remaining part 103e of the sidewall conductive layer 103e) and the top electrode TE (to be formed in a further step according to the embodiments). A final sheet resistance higher than 10e5 Ohm per square ($\Omega$/sq) is particularly useful for preventing electrical contact between bottom electrode BE and top electrode TE. With final sheet resistance is meant the sheet resistance of said complete modified sidewall conductive layer 103a or the modified remaining part 103d of the sidewall conductive layer, as shown by the dashed areas in FIG. 5A, FIG. 5B, of the completed resistive memory device. In particular embodiments said complete modified sidewall conductive layer 103a or the modified part 103d of the sidewall conductive layer of the completed resistive memory device behaves as a dielectric, i.e a non-conductive material.

In order to define the bottom electrode BE, the complete sidewall conductive layer 103 or a part of the sidewall conductive layer 103 needs to be modified. This means that its conductive properties need to be converted into non-conductive properties, more specifically dielectric or insulating properties. There are different possibilities for modifying the conductive properties of the sidewall conductive layer 103a or part thereof so as to form at least a part of the sidewall conductive layer 103a into a non-conductive part 103d.

According to an embodiment, the sidewall conductive layer 103a has a thickness which is much smaller than the thickness of the bottom conductive layer 103b, e.g. which is at least a factor 2 smaller, for example which is at least a factor 4, a factor 5, a factor 7 or a factor 10 smaller. The bottom conductive layer may have a thickness smaller than 50 nm. The thickness of the sidewall conductive layer is may be smaller than 10 nm, for example smaller than 5 nm (FIG. 6A). For example one monolayer of TiN is about 0.5 nm. The sidewall conductive layer of TiN may be about 5 nm, which resembles 10 monolayers of TiN. To achieve a sidewall conductive layer 103a with a thickness smaller than 10 nanometers, for example smaller than 5 nanometers, advantageously a non-conformal deposition technique should be used as already described above, more specifically a deposition technique such as for example ion metal plasma deposition (IMP) or self-ionized plasma sputtering (SIP), i.e a deposition technique with good top-down coverage but without significant sidewall deposition. Due to the small thickness of the sidewall conductive layer 103a (only few monolayers thick) the resistance of the sidewall conductive layer 103a will be high enough upon formation such that no electrical current can flow from the bottom electrode BE (comprising the bottom conductive layer 103b) towards the top electrode TE. It is even advantageous that the sidewall conductive layer 103a is oxidized upon deposition of the conductive layer, thus forming the modified sidewall part 103d. Otherwise said, the conductive properties of the sidewall conductive layer 103a may be modified upon formation. This is due to the interface interaction between the sidewall conductive layer 103a and the dielectric layer 102.

If for example a conductive layer 103 of TiN with a desired thickness of 5 nm is formed using SIP and for example SiO2 is used as dielectric layer 102, the sidewall TiN layer 103a will convert into TiO2 upon deposition. This is due to the fact that TiN is very reactive with respect to oxygen, and as such there will be an interface reaction of SiO2 with TiN so as to form TiO2. As the TiN-layer comes in contact with the SiO2 layer 102 upon deposition, and since TiO2 is more stable than TiN, the TiN-layer 103a will convert into a TiO2 layer 103d. O2 from the SiO2 is incorporated into the Ti-layer as such converting the TiN-layer into TiO2 at the sidewall surface 108a of the trench 108.

According to another embodiment the thickness of the sidewall conductive layer 103a is higher than 10 nanometers, but the thickness remains smaller than or equal to the thickness of the bottom conductive layer 103b (FIG. 6B). The conductive layer 103 in this case may be deposited using a non-conformal deposition technique or a conformal deposition technique. To achieve a high resistance for at least part of the sidewall conductive layer 103d, the sidewall conductive layer 103a may be at least locally (in length direction of the trench 108) modified over its whole thickness. In particular embodiments, the sidewall conductive layer 103a may be locally (in length direction of the trench 108) oxidized over its whole thickness. In this case the bottom electrode BE is defined by the bottom conductive layer 103b and the non-oxidized part 103e of the sidewall conductive layer 103a (as shown in FIG. 5B). As such the sidewall conductive layer will only partially contribute electrically when operating the completed resistive memory device. Alternatively the sidewall conductive layer 103a may be completely oxidized in length direction of the trench 108 over its whole thickness (as shown in FIG. 5A), so as to form the non-conductive part 103d of the sidewall conductive layer. In this case the bottom electrode BE is only defined by the bottom conductive layer 103b. As such the sidewall conductive layer 103d will not contribute electrically when operating the completed resistive memory device.

The complete or local modification (in length direction of the trench 108), for example oxidation, over the whole thickness of the sidewall conductive layer 103d may be performed in a separate oxidation step after depositing the conductive layer 103. This may be done using a plasma oxidation step. The complete or local modification (in length direction of the trench 108), for example oxidation, over the whole thickness of the sidewall conductive layer 103d may also be performed, after depositing the conductive layer 103, simultaneously with the subsequent step of forming the resistive switching element, this step involving an oxidation step to convert a metal into a resistive switching material (see further).

The thickness of the conductive layer at the bottom of the trench 108 (bottom conductive layer 103b) should be smaller than the length L of the trench 108 so that the conductive layer 103 only partially fills the trench 108. The thickness of the bottom conductive layer 103b may be less than 50 nm.

For geometrical reasons the thickness of the sidewall conductive layer 103a is preferably smaller than half of the minimal diameter Dmin of the trench 108.

After the formation of the conductive layer 103 in the trench 108, an opening or cavity 109 is left in the trench. The conductive layer 103 only partially fills the trench.

Resistive Switching Material Deposition

After forming the conductive layer 103, a resistive switching element 140 is formed in the cavity 109 of the trench 108, the resistive switching element 140 being in contact with the bottom conductive layer 103b and the sidewall conductive layer 103a.

The resistive switching element 140 is formed from a resistive switching material which at least partially fills the cavity 109. Various types of resistive switching materials can be used to form a resistive switching layer from which the resistive switching element 140 can be made. In particular embodiments of the invention, the resistive switching material is made from a starting material that undergoes a process, such as for example oxidation, so as to form the switching material. In advantageous embodiments of the invention the same process also modifies the conductive properties of the conductive layer.

As illustrated schematically in FIG. 7A, FIG. 7B a resistive switching material or a starting material for forming the resistive switching material, indicated 104, for example a metal layer, is formed on the exposed conductive layer 103. The resistive switching material layer is in contact with the bottom conductive layer 103b and the sidewall conductive layer 103a or sidewall non-conductive layer 103d or both the sidewall non-conductive layer 103d and the sidewall conductive layer 103e. The resistive switching material layer may also be in contact with the top conductive layer 103c, if still present (FIG. 7A) or with the top surface of the dielectric layer 102 (FIG. 7B).

Figure 8B:
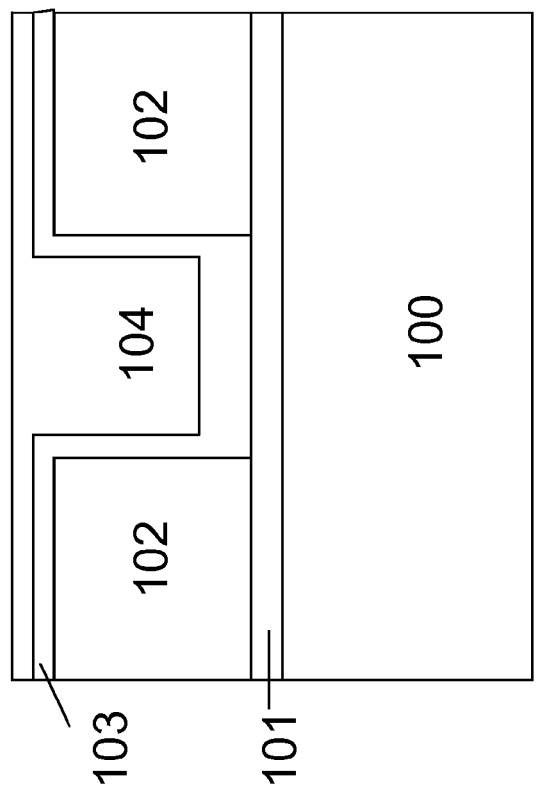
Figure 8A:
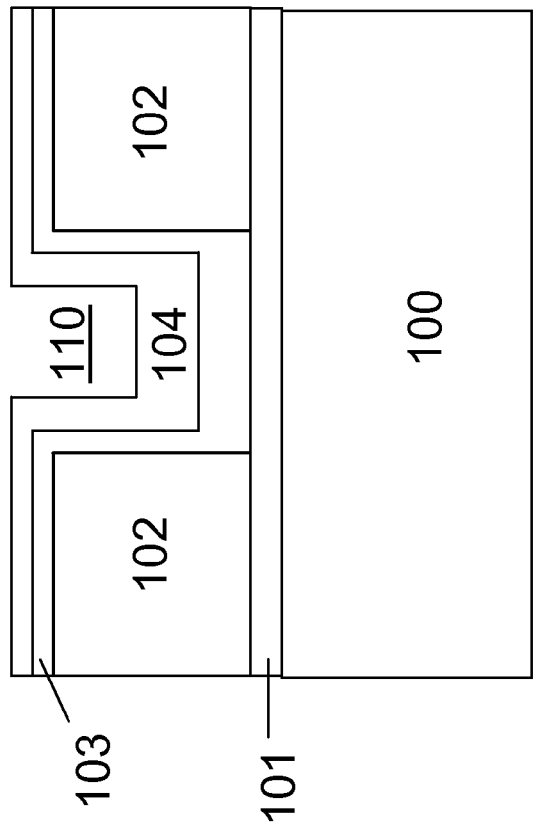
Figure 9A:
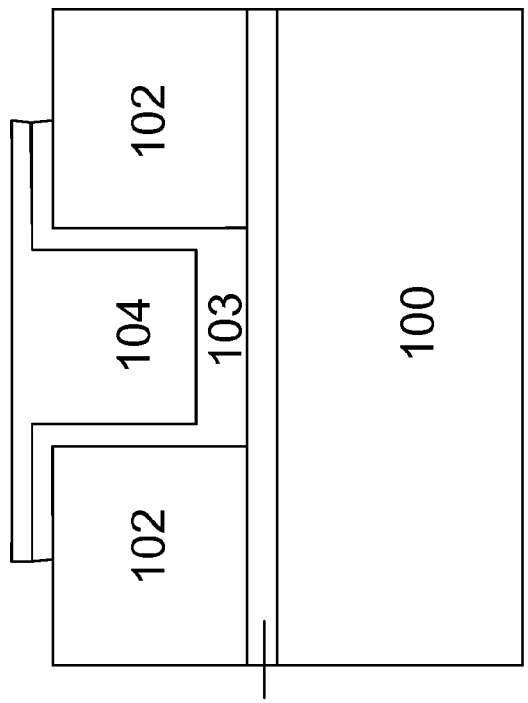
Figure 9B:
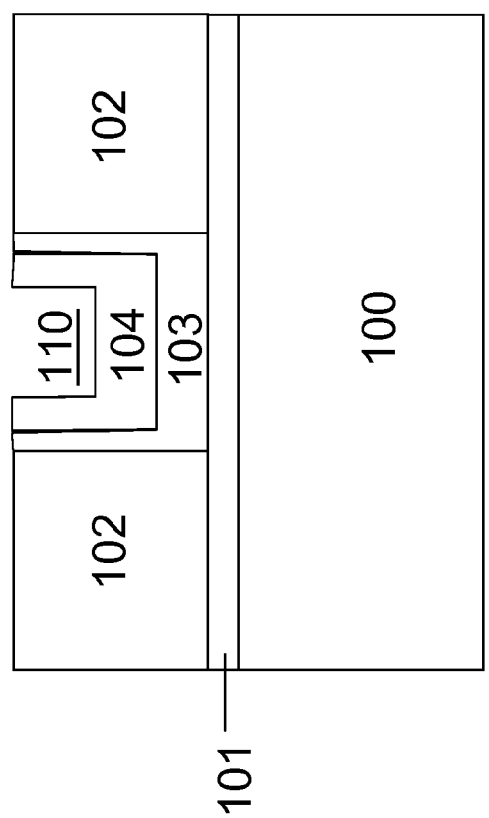

As illustrated in FIG. 8A, the resistive switching material layer 104 may be formed as a liner over the exposed conductive layer 103. In this case, a trench 110 is provided in the resistive switching material layer 104. Alternatively, the resistive switching material layer may be formed in contact with the exposed conductive layer 103 thereby completely filling the remaining cavity 109 (FIG. 8B). In particular embodiments, the resistive switching material may be confined to the cavity 109 such that the resistive switching element does not extend beyond the cavity 109. The thickness of the resistive switching layer in this case is equal to or less than the height of the cavity 109, where the height of the cavity 109 is defined in the same direction as the length L of the trench 108.

The resistive switching material layer 104 in contact with the top conductive layer 103c (if present) may be completely (FIG. 9A) or partially (FIG. 9B) removed where it extends outside the cavity 109. A complete removal of the resistive switching material 104 present outside the cavity 109 may be done for example by polishing, such as chemical polishing (CP) or chemical-mechanical polishing (CMP) or etch-back. A partial removal of the resistive switching material 104 may be done by patterning of the resistive switching material such that only part of the resistive switching material remains available outside the cavity 109, optionally on top of top conductive layer 103c (if present). This step of partially or completely removing the resistive switching material 104 may be done together with the step of partially or completely removing the top conductive layer 103c. This step of partially or completely removing the resistive switching material 104 (and if present the top conductive layer 103c) may in particular cases be done prior to the formation of the top electrode.

In particular embodiments, the formation of the resistive switching element 140 may comprise the steps of providing a metal layer 104 in part of the cavity 109 and oxidizing the metal layer 104 thereby forming the resistive switching element 140. The metal layer 104 may comprise any metal suitable for oxidation and conversion into a resistive switching element such as for example transition metals (to be converted into transition metal oxides) such as for example Ni, Ti, W, Cu. Other examples of such reversible resistivity-switching active material are chalcogenides, carbon polymers, selected binary metal oxides such as nickel-oxide, tungsten-oxide, cupper-oxide, ternary metal oxides such as nickel-cobalt-oxide or even more complex metal oxides such as Cr-doped Sr(Ti)ZrO3 or Pr0.7Ca0.3Mn0.3.

If a metal layer 104 is used, it may be formed using deposition techniques which are typically used for barrier and/or seed layer deposition (also often called liner deposition) in trenches or vias well known for a person skilled in the art in back-end-of-line (BEOL) semiconductor processing. Examples of such deposition techniques are Ionized Metal Deposition (IMP), Physical Vapor Deposition (PVD). Other possible deposition techniques are Chemical Vapor Deposition (CVD) or Atomic Layer Deposition (ALD). In particular embodiments, the deposition of the metal layer 104 may be conformal.

The thickness of the metal layer 104 may be in the range of about 20 nm to 250 nm, for example in the range of 20 nm to 50 nm. The thickness of the metal layer 104 depends on the minimal diameter Dmin of the trench 108 and hence on the minimal diameter of the cavity 109.

After the formation of the metal layer 104 the trench 108 comprises a stack of layers, said stack of layers comprising the conductive layer 103 and the metal layer 104. Depending on the thickness of the conductive layer 103, the sidewall conductive layer 103d (or at least part of the sidewall conductive layer 103d) may already be modified, more specifically be made non-conductive, for example oxidized (see above).

To form the resistive switching element 140 the metal layer 104, if used, needs to be oxidized. This may be done by performing a thermal treatment of the stack of layers (conductive layer 103 and metal layer 104). The metal layer 104 is heated during this thermal treatment in an oxygen-free ambient, preferably in a vacuum ambient. This thermal treatment step in an oxygen-free ambient is aimed at stabilizing the microstructure, such as grain size and crystal orientation of the as-deposited metal layer 104, essentially without oxidizing the metal layer. As an example, a temperature in the range from 400 to 500° C. for a time of 10 to 20 minutes may be used under vacuum conditions to prevent preliminary oxidation of the metal layer 104. The annealed metal layer may be converted completely into a metal-oxide layer or, in particular embodiments, may be converted partially in a metal-oxide layer, i.e. with an interface between the metal part (lower part) and metal-oxide part (upper part). The metal-oxide layer may also have an oxygen gradient over the thickness of the metal-oxide layer from its upper part (i.e. the part which will be in contact with the top electrode TE) to its lower part (i.e. the part which will be in contact with the bottom electrode BE). The metal-oxide layer forms the resistive switching element 140.

This conversion of the annealed metal layer into a stack of a resistive metal-oxide layer and a conductive metal layer can be done using various processes such as thermal oxidation of the metal layer 104, plasma oxidation of the metal layer 104 using e.g. microwave remote plasma oxidation, implantation of oxygen in the upper part of the metal followed by a thermal treatment step to form the metal-oxide layer. As an example, a Rapid Thermal Anneal (RTA) in pure oxygen at a temperature up to 400° C. or higher may be used to oxidize an upper part of the metal layer.

In an example a Ni layer 104 is deposited. After thermal treatment (vacuum anneal and oxidation) the Ni-layer may be completely converted into NiO 140 or may be partially converted into NiO. With partially converted is meant that the exposed upper part of the Ni layer does contain oxygen, while a lower part of the Ni layer remains unoxidized and is part of the bottom electrode.

The cavity 109 may be partially (FIG. 8A) or completely filled (FIG. 8B) with the resistive switching material 140 thus formed.

During the formation of the resistive switching element 140, e.g. the thermal treatment and/or oxidation of the metal layer 104, also the complete sidewall conductive layer 103a or at least part of the sidewall conductive layer may be oxidized (FIG. 10A and FIG. 10B, respectively), so as to form non-conductive sidewall layer (or part) 103d. Not only the metal film 104 is thus converted into a metal-oxide film (or a metal-oxide/metal stack), but also the complete sidewall conductive layer 103a (FIG. 10A) or at least part of the sidewall conductive layer 103a (FIG. 10B) is converted into a sidewall metal-oxide layer 103d. The sidewall conductive layer 103a or at least part of the sidewall conductive layer 103a may thus be modified into a non-conductive layer or part 103d simultaneously with the formation of the resistive switching element 140.

If for example the sidewall conductive layer 103a comprises Ti and the metal layer 104 comprises Ni, the sidewall conductive layer 103a may be converted partially or completely (in direction of the length L of the trench 108), but over its whole thickness (the thickness being defined in a direction perpendicular to the length L of the trench 108) into TiO2 103d and the metal layer 104 may be converted partially or completely into NiO 140. In certain embodiments, the sidewall conductive layer 103a is oxidized over its whole thickness in order to prevent any conduction of current from the bottom electrode BE to the top electrode TE via this sidewall conductive layer 103a. In particular embodiments, the thickness of the sidewall conductive layer 103a should be chosen such that it may be converted over its whole thickness into a sidewall metal-oxide layer 103d.

Figures 17A, 17B, 17C:
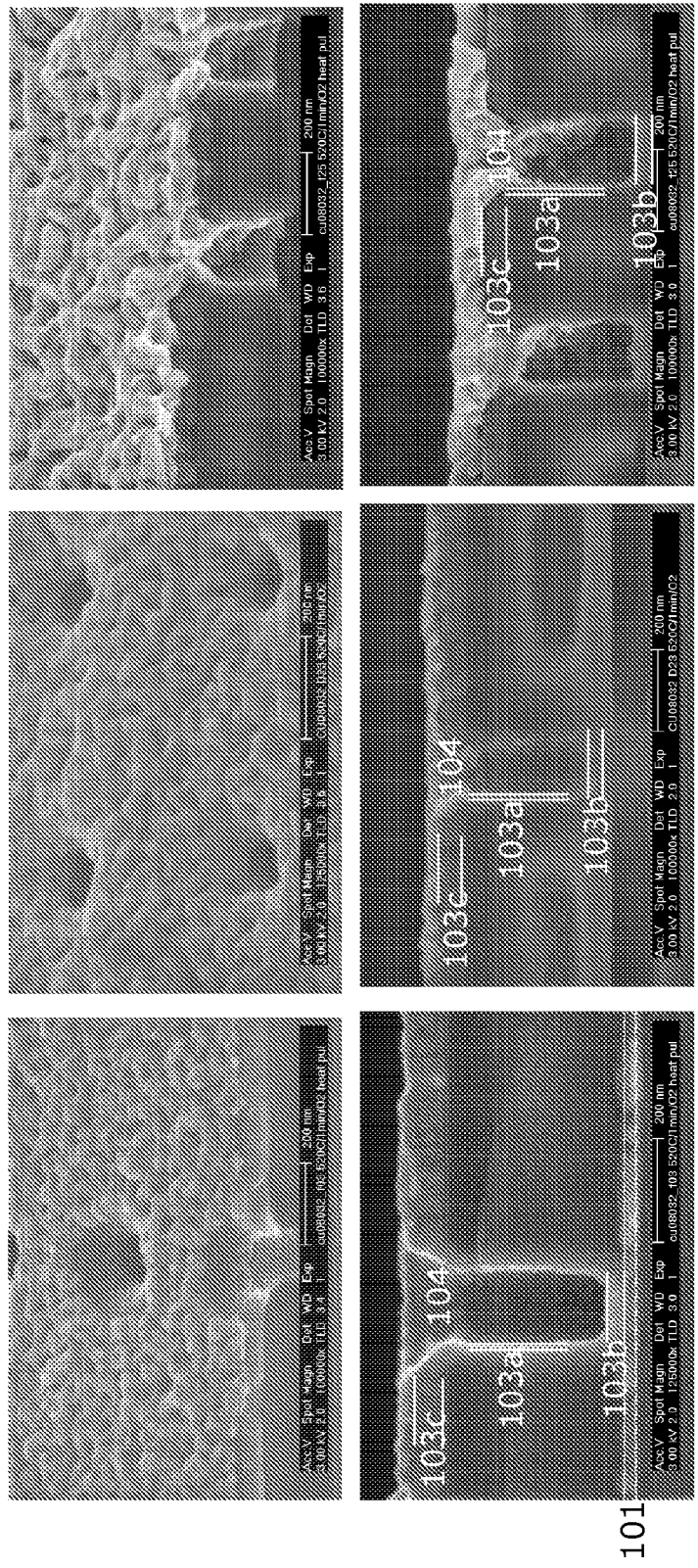
FIG. 17 shows experimental results of forming a conductive layer and resistive switching element into a trench according to embodiments of the present invention. The figures represent secondary electron microscopy images of cross-sections through the contact.

FIG. 17A, FIG. 17B and FIG. 17C show experimental results of forming a conductive layer 103 and resistive switching element into a trench 108 according to embodiments of the present invention. The FIG. 17A, B and C show different secondary electron microscopy (SEM) images of cross-sections through the resistive memory device. Although it is not straightforward to cleave through the resistive memory device for SEM imaging, it can be seen that a conductive layer 103 of TiN is formed as a liner in the trench 108 whereby the sidewall coverage 103a is marginal compared to the top and bottom coverage 103b, 103c. The conductive layer 103, in the embodiments illustrated, is deposited using ion metal plasma deposition (IMP). The thickness of the sidewall TiN-layer 103a is 5 nm, whereas the thickness of the bottom 103b and top 103c TiN-layer is 30 nm. After forming the TiN-layer 103 a Ni layer 104 is formed and oxidized in the remaining part of the trench to form the resistive switching element 140. Different thicknesses are used for the Ni layer 104. For a Ni layer with 10 nm thickness (FIG. 17A) it is seen that the Ni layer is formed over the conductive TiN-liner 103a, 103b, 103c, thus filling only part of the trench 108, while with a 50 nm thickness (FIG. 17C) the Ni liner 104 is does not fill the trench 108 uniformly, thus forming voids underneath the Ni layer 104. During deposition of the metal layer 104 (which will be converted into the resistive switching element), one should consider the volume expansion of the metal layer 104 which may happen during oxidation. It is known from the state of the art that for example the thermal expansion coefficient for Ni (into NiO) is about 1.6 or for W (into WO3) is even more than 3. Due to the volume expansion the size of the contact should also be taken into account. FIG. 17B shows an intermediate possibility with a Ni layer of 30 nm. In this case the trench 108 is better filled with Ni compared to FIG. 17C.

Different possibilities are proposed for modifying at least part of the sidewall conductive layer 103a and forming the resistive switching element 140.

One possibility is that the complete sidewall conductive layer 103a is modified (for example oxidized) upon deposition of the layer 103, thus forming the oxidised sidewall conductive layer 103d. This may be the case for non-conformal deposition of the conductive layer 103 with only a few monolayers of sidewall conductive layer 103a formed. Thereafter the resistive switching element 140 may be formed by forming a metal layer 104 over the conductive layer 103 and performing an oxidation step, as such converting the metal layer 104 into a metal-oxide layer acting as the resistive switching element (FIG. 10A).

A second possibility is that only part of the sidewall conductive layer 103a (or alternatively the complete sidewall conductive layer 103a) in length direction L of the trench 108 is modified in a separate oxidation step, after the formation of the sidewall conductive layer 103a and before the formation of metal layer 104 for forming the resistive switching element. This modifying of at least part of the sidewall conductive layer 103a, thus forming a non-conductive part 103d, may be done by any suitable method, for example using plasma oxidation. This can for example be used in high aspect ratio trenches (an aspect ratio higher than 5) (FIG. 10A or FIG. 10B).

Figure 10A:
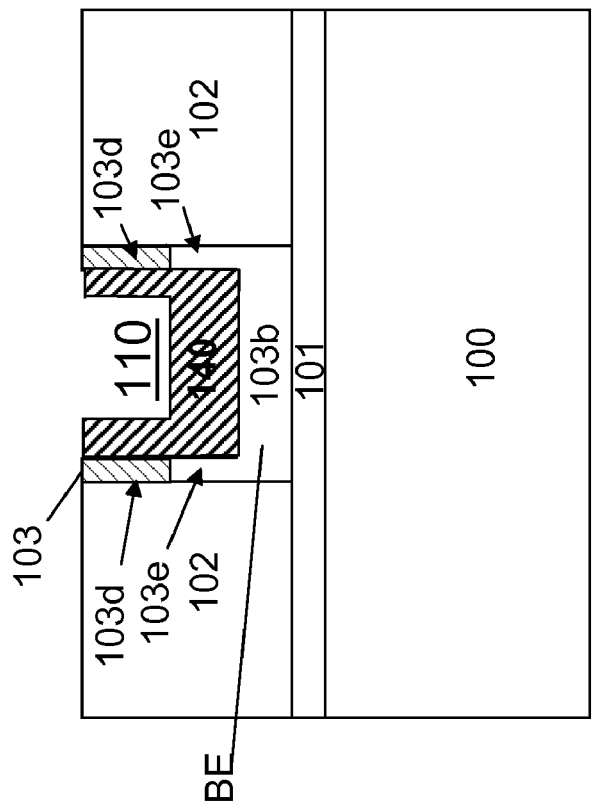
Figure 10B:
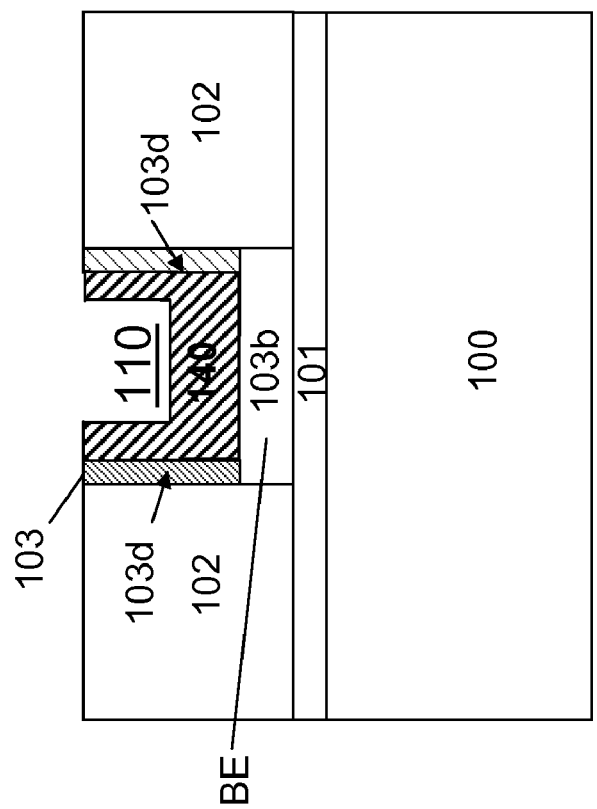

A third possibility is that the complete sidewall conductive layer 103a is modified simultaneously with the step of forming the resistive switching element, more specifically simultaneously with the step of oxidizing the metal layer 104 (FIG. 10A).

It is also possible, according to embodiments of the present invention, that the formation of the resistive switching element 140 comprises immediately depositing an oxide layer in part of the cavity 109, rather than providing a metal layer and transforming it into a metal-oxide. For example a NiO layer may be deposited in part of the cavity 109 using deposition techniques known to a person skilled in the art.

Formation of Top Electrode

After forming the resistive switching element 140, a top electrode TE 105 of the resistive memory device is formed.

The top electrode 105 comprises a conductive material, such as a metal or a stack of metals. In particular embodiments, the top electrode 105 comprises any metal selected from Ni, Ti, TiN, Pt, Au or noble metals, Ru, Ir, IrO2, RuO, TaC(N), or any combination made thereof.

Figure 11A:
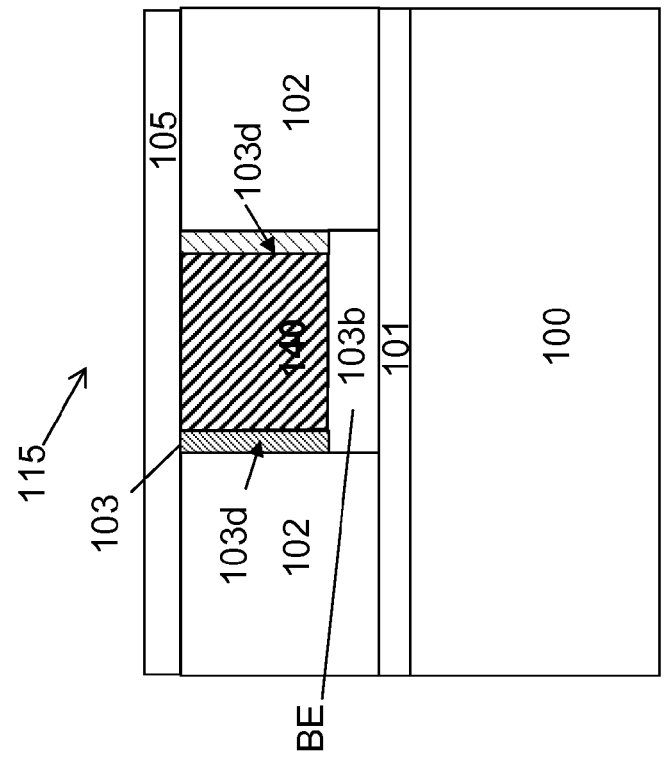
Figure 11B:
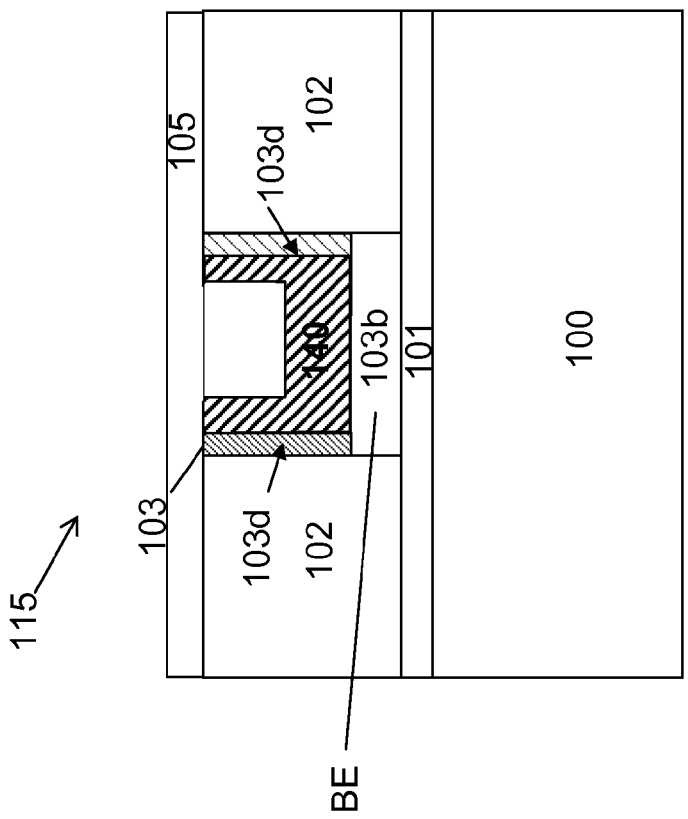

The top electrode 105 may be deposited using any deposition technique such as for example PVD, ALD, CVD, pulsed CVD. The top electrode 105 may be only present on top of the dielectric layer 102 in contact with the resistive switching element 140 and part of the (modified) conductive layer 103d (FIG. 11B) or may also be present in the trench 110 in contact with the resistive switching element 140 (FIG. 11A).

The thickness of the top electrode 105 may be higher than 50 nm, for example between 50 nm and 200 nm.

The top electrode 105 on top of the dielectric layer 102 may be completely (FIG. 12A) or partially (FIG. 12B) removed. A complete removal of the top electrode 105 present outside the trench 110 may be done for example by polishing, such as chemical polishing (CP) or chemical-mechanical polishing (CMP) or etch-back. A partial removal of the top electrode 105 may be done by patterning of the top electrode 105 such that only part of the top electrode 105 remains available outside the trench 110. This step of partially or completely removing the top electrode 105 may be done together with the step of partially or completely removing the top conductive layer 103 and/or metal layer 104 (which is used to form the resistive switching element).

After forming the bottom electrode 103b, the resistive-switching element 140 and the top electrode 105, more specifically in the first metal interconnect level, additional processing may be carried out to form the complete interconnect structure as known to a person skilled in the art in standard Back-End-Of-Line BEOL processing. Additional metal layers may be formed. After cell formation tungsten (W) plugs may be formed on top of the cell and contact the resistive memory device 115.

Embodiments of certain inventive aspects also relate to a resistive memory device 115 comprising a top electrode 105, a bottom electrode 103b and a resistive switching element, the bottom electrode 103b and the resistive switching element being provided in a trench 108. The resistive memory device further comprises a non-conductive layer 103a, 103e at the sidewall surface(s) 108a of the trench 108, the non-conductive layer 103a, 103e being in contact with the bottom electrode 103b and the resistive switching element. The bottom electrode 103b comprises a metal. The non-conductive layer 103a, 103e comprises the same metal as the bottom electrode 103b. The non-conductive layer 103a, 103e may comprise a metal-oxide layer wherein the metal is the same as the metal of the bottom electrode 103b. The non-conductive layer 103a, 103e has a thickness which may be smaller than 10 nm, in particular embodiments smaller than 5 nm, down to a few atomic layers thickness.

The resistive memory device 115 (comprising bottom electrode BE, top electrode TE, and resistive switching element) as fabricated according to the embodiments of the present invention may be integrated using structures derived from the 1T/1R (one transistor/one resistor) and 1D/1R (one diode/one resistor) concept as used in dynamic RAM. For a 1T/1R cell a possible schematic integration scheme is shown in FIG. 13. This includes a completed MOS device 150 comprising the resistive memory device 115 according to embodiments of the present invention coupled to a switching element, e.g. connected to the contact 101a of the source region 107a of a transistor device. The bottom conductive layer 103b may be integrated in the first contact of the transistor, i.e. the M0 wiring local interconnect level, wherein only the bottom part 103b is defining the bottom electrode BE according to certain embodiments. At the gate 106 and drain region 107b other contacts, respectively 112 and 113, are provided at the M0 wiring local interconnect level. The conductive contacts 112, 113 and the resistive memory device 115 are electrically isolated by means of the dielectric layer 102.

Figure 14:
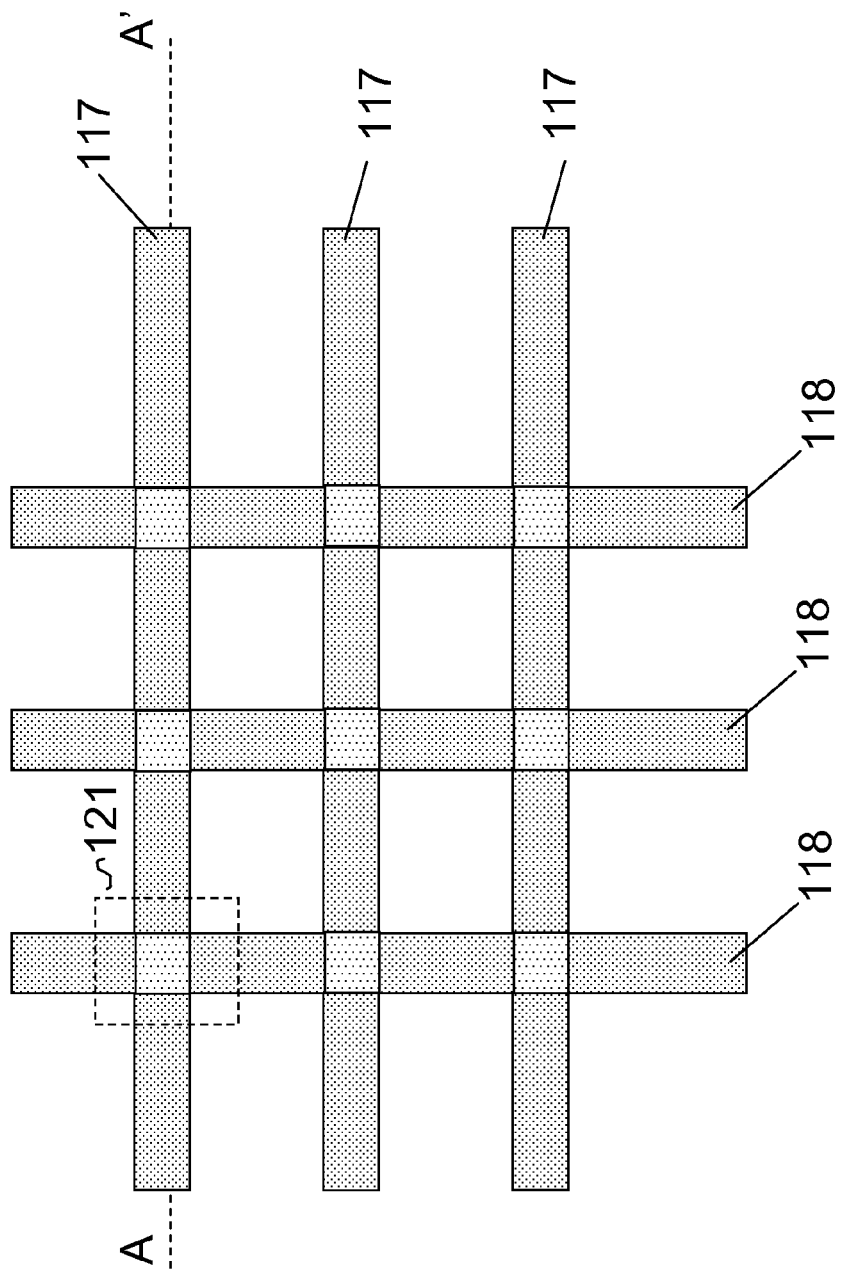
FIG. 14 shows a schematic representation of a possible 1D/1R integration scheme, i.e. incorporating a resistive switching memory element manufactured according to embodiments of the present invention with a diode element into a crossbar memory device.
Figure 15:
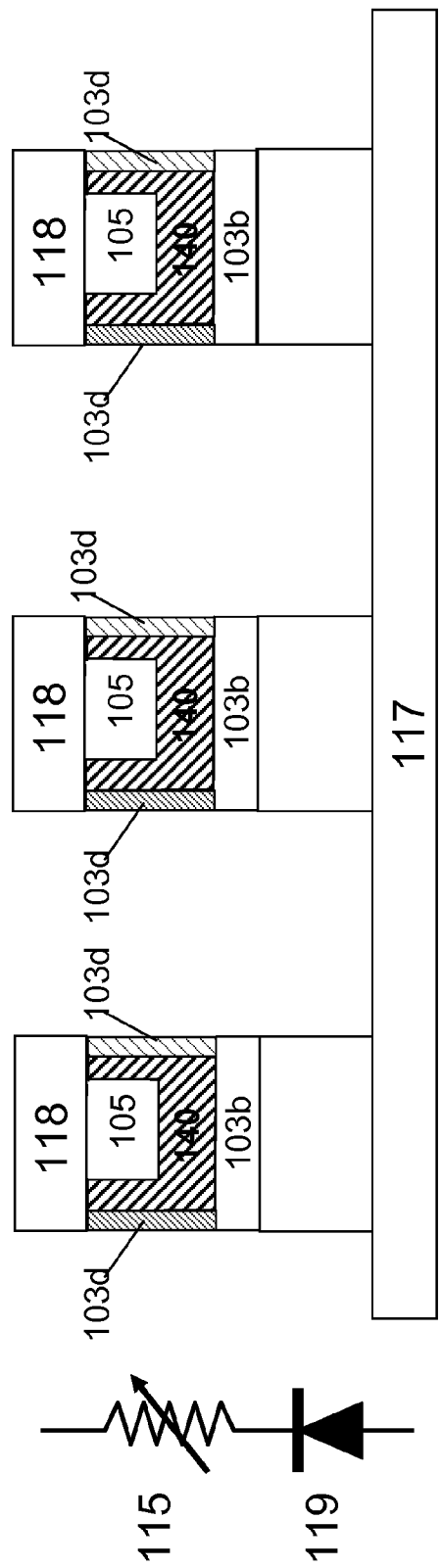
FIG. 15 shows a schematic representation of a cross-section according to A-A' of FIG. 14, i.e. a cross-section of a device incorporating a resistive switching memory element manufactured according to embodiments of the present invention with a diode element into a crossbar memory device.

Another possibility is integrating the resistive memory cell 115 as fabricated according to the embodiments of the present invention using structures derived from the 1D/1R (one diode/one resistor) concept. For this concept a dense array in crossbar configuration is typically used. FIG. 14 shows schematically an example of such array of structures incorporating the resistive memory cell 115 fabricated according to certain embodiments of the invention. Metal lines of a first metal pattern 117 run perpendicular over metal lines of a second metal pattern 118. As the metal patterns 117, 118 are formed at different levels, the corresponding metal lines will cross each other. At each cross point 121 a resistive memory element 115 according to embodiments of the present invention and a diode (switching element) are connected between the two metal patterns 117, 118. FIG. 15 shows schematically a cross-section (according to A-A' from FIG. 14) through a possible cell configuration at the cross-point 121 between the first 117 and the second 118 metal patterns. In between the first 117 and the second 118 metal patterns, the diode 119 (switching element) and the resistive memory cell 115 (memory element) according to embodiments of the present invention may be incorporated. The diode 119 may be put in series with the resistive memory cell 115 between the first 117 and second 118 metal pattern.

Figure 16:
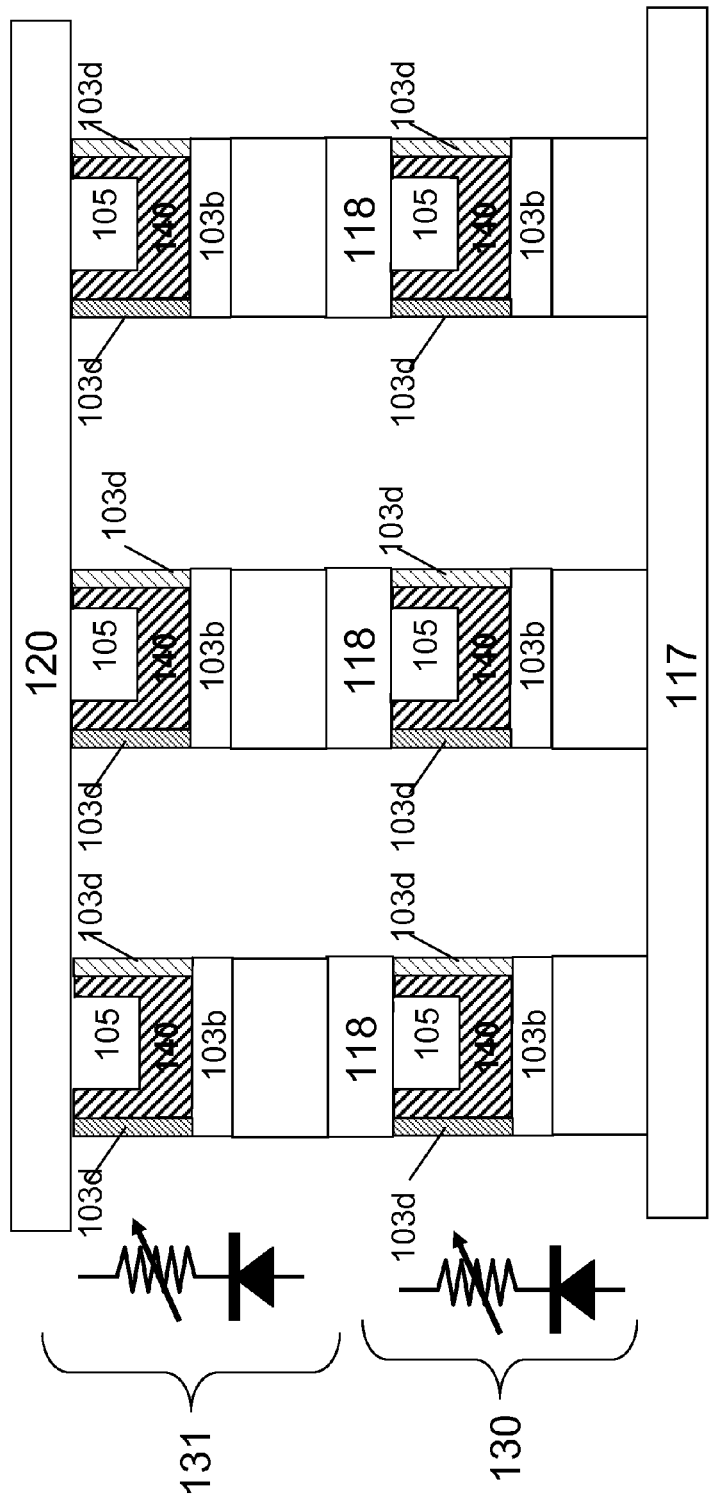
FIG. 16 shows a schematic cross-sectional representation of a device incorporating a resistive switching memory element manufactured according to embodiments of the present invention with a diode element into a crossbar memory device with different levels of metal patterns, as such creating a three dimensional stacking.

Alternatively different levels of word and bit lines, i.e. different levels of metal patterns 117, 118, 120, may be used as such creating a multi-dimensional stacking FIG. 16 schematically shows an example for a 3-dimensional stacking integration, i.e. the integration of two levels of resistive memory cells 130, 131 into three metal patterns 117, 118, 120.

In a particular embodiment the resistive memory element is directly stacked on top of the switching element, e.g. transistor. The resistive memory element 115 is thus for example formed at the M0 wiring local interconnect level, e.g. using the first contact to the transistor. Thereby higher integration densities are possible compared to the higher metal interconnect levels.

As the switching behaviour of the resistive switching device 115 is defined by the bottom electrode 103b, the scalability of the resistive memory device 115 depends on the scalability of the trenches 108 or vias, i.e. the integrated circuit contact sizes.

In certain embodiments a resistor element comprising a resistive switching layer may be manufactured which is scalable for at least several technology generations from the 45 nm CMOS node and beyond.

In certain embodiments a resistive memory device may be manufactured using technology and materials which are compatible with present and future generations of CMOS. Otherwise methods according to certain inventive aspects of the present invention facilitate the integration of resistive switching materials in CMOS compatible process flows, more specifically in the CMOS compatible back-end-of-line (BEOL) processes.

In certain embodiments nonvolatile memory devices may be manufactured which allow integration into different memory architectures that can lead to different memory products and applications.

In certain embodiments the volume of resistive oxide (for the resistive switching element 140) needed for the resistive switching device may be tuned by tuning the aspect ratio of the contact trench 108. A small size for the contact 103b may be kept for a predetermined volume of resistive oxide.

What is claimed is:

1. Method for manufacturing a resistive memory device, the resistive memory device comprising a top electrode (TE), a bottom electrode (BE) and a resistive switching element, the method comprising:
   providing a substrate comprising an electrical contact;
   providing on the substrate a dielectric layer comprising a trench exposing the electrical contact, the trench comprising at least one sidewall surface and a bottom surface and providing in the trench at least the bottom electrode (BE) and the resistive switching element of the resistive memory device;
   wherein providing in the trench at least the bottom electrode (BE) and the resistive switching element further comprises:
      forming a conductive layer on the at least one sidewall surface and on the bottom surface of the trench thereby only partially filling the trench so as to leave a cavity in the trench, the conductive layer comprising a sidewall conductive layer in contact with the at least one sidewall surface of the trench and a bottom conductive layer in contact with the bottom surface of the trench;
      modifying the conductive properties of at least part of the sidewall conductive layer, the bottom electrode (BE) comprising the bottom conductive layer and the unmodified part of the sidewall conductive layer; and
      forming the resistive switching element in at least part of the cavity of the trench, the resistive switching element being in contact with the bottom conductive layer and in contact with at least part of the modified or unmodified sidewall conductive layer.

2. Method according to claim 1, furthermore comprising forming a top electrode (TE) in contact with the resistive switching element.

3. Method according to claim 1, wherein forming the resistive switching element comprises providing a resistive switching layer in at least part of the cavity of the trench.

4. Method according to claim 1, wherein forming a resistive switching element in at least part of the cavity of the trench comprises:
   providing a metal layer in at least part of the cavity,
   oxidizing the metal layer, thereby forming a metal-oxide material, the resistive switching element consisting of the metal-oxide material.

5. Method according to claim 1, wherein modifying the conductive properties of at least part of the sidewall conductive layer comprises converting the conductive properties of at least part of the sidewall conductive layer into dielectric properties.

6. Method according to claim 5, wherein converting the conductive properties of at least part of the sidewall conductive layer into dielectric properties comprises oxidation of at least part of the sidewall conductive layer.

7. Method according to claim 5, wherein modifying the conductive properties of at least part of the sidewall conductive layer is performed before forming the resistive switching element.

8. Method according claim 5, wherein modifying the conductive properties of at least part of the sidewall conductive layer occurs upon the formation of the sidewall conductive layer.

9. Method according claim 5, wherein modifying the conductive properties of the sidewall conductive layer is performed simultaneously with forming the resistive switching element.

10. Method according to claim 1, wherein the sidewall conductive layer has a first thickness (Ts) and the bottom conductive layer has a second thickness (Tb), whereby the first thickness (Ts) is equal to or smaller than the second thickness (Tb).

11. Use of the method according to claim 1 in the manufacturing process of a 1T/1R RAM or a 1D/1R RAM device.

12. Use of the method according to claim 1 in the manufacturing process of multi-dimensional stacked memory device.

* * * * *